(12) United States Patent
Mabuchi

(10) Patent No.: US 10,868,989 B2
(45) Date of Patent: Dec. 15, 2020

(54) IMAGING DEVICE AND ELECTRONIC APPARATUS WITH UPPER AND LOWER SUBSTRATES

(71) Applicant: SONY CORPORATION, Tokyo (JP)

(72) Inventor: Keiji Mabuchi, Kanagawa (JP)

(73) Assignee: Sony Corporation, Toyko (JP)

( * ) Notice: Subject to any disclaimer, the term of this patent is extended or adjusted under 35 U.S.C. 154(b) by 0 days.

(21) Appl. No.: 16/521,137

(22) Filed: Jul. 24, 2019

(65) Prior Publication Data

US 2019/0349543 A1 Nov. 14, 2019

Related U.S. Application Data

(63) Continuation of application No. 15/879,776, filed on Jan. 25, 2018, now Pat. No. 10,397,506, which is a (Continued)

(30) Foreign Application Priority Data

Aug. 5, 2013 (JP) .................................. 2013-162208

(51) Int. Cl.
*H04N 5/335* (2011.01)
*H04N 5/369* (2011.01)
(Continued)

(52) U.S. Cl.
CPC ............ *H04N 5/3698* (2013.01); *H03M 1/56* (2013.01); *H04N 5/378* (2013.01); *H04N 5/379* (2018.08);
(Continued)

(58) Field of Classification Search
CPC ...................................................... H03M 1/56
See application file for complete search history.

(56) References Cited

U.S. PATENT DOCUMENTS

| 4,647,955 A | 3/1987 | Portmann et al. |
| 2006/0023109 A1 | 2/2006 | Mabuchi et al. |

(Continued)

FOREIGN PATENT DOCUMENTS

| JP | 2009-017720 | 1/2009 |
| JP | 2011-159958 | 8/2011 |

(Continued)

OTHER PUBLICATIONS

Official Action (with English translation) for Korean Patent Application No. 10-2015-7035234, dated Apr. 13. 2020, 10 pages.

*Primary Examiner* — Gary C Vieaux
(74) *Attorney, Agent, or Firm* — Sheridan Ross P.C.

(57) ABSTRACT

The present technology relates to an imaging device that can reduce the size thereof, and to an electronic apparatus. An upper substrate and a lower substrate are stacked. A pixel and a comparing unit that compares the voltage of a signal from the pixel with the ramp voltage are provided on the upper substrate, the ramp voltage varying with time. A storage unit that stores a code value obtained at a time when a comparison result from the comparing unit is inverted is provided on the lower substrate. The comparing unit is formed with a transistor that receives the voltage of the signal from the pixel at the gate, receives the ramp voltage at the source, and outputs a drain voltage. Accordingly, the imaging device can be made smaller in size. The present technology can be applied to image sensors.

9 Claims, 20 Drawing Sheets

Related U.S. Application Data continuation of application No. 14/908,185, filed as application No. PCT/JP2014/069276 on Jul. 22, 2014, now Pat. No. 9,918,030.

(51) Int. Cl.
  *H03M 1/56* (2006.01)
  *H04N 5/378* (2011.01)
  *H04N 5/3745* (2011.01)

(52) U.S. Cl.
  CPC ..... *H04N 5/37455* (2013.01); *H04N 5/37457* (2013.01)

(56) References Cited

U.S. PATENT DOCUMENTS

| | | | |
|---|---|---|---|
| 2008/0062290 A1* | 3/2008 | Lahav | H01L 27/14621 348/280 |
| 2010/0019127 A1 | 1/2010 | Kagawa et al. | |
| 2011/0180689 A1 | 7/2011 | Roy et al. | |
| 2012/0008032 A1* | 1/2012 | Kurihara | H04N 5/3598 348/308 |
| 2013/0048832 A1 | 2/2013 | Peizerat et al. | |
| 2013/0062505 A1 | 3/2013 | Masuda | |
| 2013/0126709 A1 | 5/2013 | Bianquart | |
| 2013/0250151 A1* | 9/2013 | Kato | H04N 5/335 348/300 |
| 2014/0139713 A1 | 5/2014 | Gomi et al. | |
| 2014/0191112 A1 | 7/2014 | Kusano et al. | |
| 2015/0288906 A1 | 10/2015 | Saito et al. | |

FOREIGN PATENT DOCUMENTS

| | | |
|---|---|---|
| JP | 4825982 | 11/2011 |
| JP | 2013110566 A * | 6/2013 |
| KR | 10-2007-0015056 | 2/2007 |

\* cited by examiner

IMAGING DEVICE AND ELECTRONIC APPARATUS WITH UPPER AND LOWER SUBSTRATES

CROSS REFERENCE TO RELATED APPLICATIONS

This application is a continuation of U.S. patent application Ser. No. 15/879,776, filed Jan. 25, 2018, which is a continuation of U.S. patent application Ser. No. 14/908,185, filed Jan. 28, 2016, now U.S. Pat. No. 9,918,030, which is a national stage application under 35 U.S.C. 371 and claims the benefit of PCT Application No. PCT/JP2014/069276 having an international filing date of Jul. 22, 2014, which designated the United States, which PCT application claimed the benefit of Japanese Patent Application No. 2013-162208 filed Aug. 5, 2013, the disclosures of which are incorporated herein by reference in their entirety.

TECHNICAL FIELD

The present technology relates to imaging devices and electronic apparatuses. More particularly, the present technology relates to an imaging device suitable for a size reduction, and an electronic apparatus.

BACKGROUND ART

Recent imaging devices are expected to become smaller in size, while being expected to have a larger number of pixels, higher image quality, and a higher processing speed. As an imaging device that satisfies such demands, a layered imaging device has been suggested (see Patent Document 1, for example).

In a layered imaging device, a chip having a signal processing circuit formed thereon, instead of a supporting substrate for an imaging device, is used, and the pixel portion is overlapped on the chip. It is suggested that an imaging device can be made smaller in size with such a structure.

CITATION LIST

Patent Document

Patent Document 1: Japanese Patent Application Laid-Open No. 2009-17720

SUMMARY OF THE INVENTION

Problems to be Solved by the Invention

In a layered imaging device, if the pixels are made smaller, the circuits mounted on the chip below the pixels need to be also made smaller. The circuits mounted on the chip may be AD converter circuits, for example. The AD converter circuits involve a large number of transistors, and are not easily made smaller in size. Therefore, it is suggested that one AD converter circuit should be shared by more than one pixel.

However, in a case where one AD converter circuit is shared by more than one pixel, control is performed so that signals from the pixels are read out while being switched. Therefore, if one AD converter circuit handles a large number of pixels, the time lags among the pixels to be read become larger. As a result, when a moving object is imaged, the imaged object might be distorted, or it might take a long time to read one image.

For the above reasons, the AD converter circuits mounted on the chip below the pixels are expected to be smaller in size as the pixels become smaller in size. Also, the number of pixels to be handled by one AD converter circuit is expected to become smaller.

The present technology has been developed in view of the above circumstances, and aims to provide a layered imaging device and further reduce the size of the imaging device.

Solutions to Problems

An imaging device of one aspect of the present technology includes an upper substrate and a lower substrate that are stacked. A pixel and a comparing unit that compares the voltage of a signal from the pixel with the ramp voltage of a ramp signal are provided on the upper substrate, the ramp voltage varying with time. A storage unit that stores a code value obtained at a time when a comparison result from the comparing unit is inverted is provided on the lower substrate.

The comparing unit may be formed with a transistor that receives the voltage of the signal from the pixel at the gate, receives the ramp voltage at the source, and outputs a drain voltage.

A voltage for resetting the transistor may be higher than the power-supply voltage of a circuit of a later stage.

The power-supply voltage of the storage unit may be lower than the power-supply voltage of the circuit of the later stage.

The power-supply voltage of the upper substrate may be higher than the power-supply voltage of the lower substrate.

An analog circuit may be provided on the upper substrate, and a digital circuit may be provided on the lower substrate.

The comparing unit and the storage unit may be formed with Negative channel Metal Oxide Semiconductors (NMOSs), and the comparing unit and the storage unit may have the same high power supply while having different low power supplies.

The comparing unit and the storage unit may be formed with Positive channel Metal Oxide Semiconductors (PMOSs), and the comparing unit and the storage unit may have the same low power supply while having different high power supplies.

Of the transistors included in the storage unit, a transistor that receives a signal from the comparing unit is made to have a high withstand voltage.

An electronic apparatus of one aspect of the present technology includes: an imaging device including an upper substrate and a lower substrate that are stacked, wherein a pixel and a comparing unit that compares the voltage of a signal from the pixel with the ramp voltage of a ramp signal varying with time are provided on the upper substrate, and a storage unit that stores a code value obtained at a time when a comparison result from the comparing unit is inverted is provided on the lower substrate; and a signal processing unit that performs signal processing on a signal that is output from the imaging device.

In an imaging device of one aspect of the present technology, an upper substrate and a lower substrate are stacked. A pixel and a comparing unit that compares the voltage of a signal from the pixel with the ramp voltage of a ramp signal are provided on the upper substrate, the ramp voltage varying with time. A storage unit that stores a code value obtained at a time when a comparison result from the comparing unit is inverted is provided on the lower substrate.

An electronic apparatus of one aspect of the present technology includes the above imaging device.

Effects of the Invention

According to one aspect of the present technology, a layered imaging device can be formed. Also, the size of the imaging device can be further reduced.

It should be noted that effects of the present technology are not limited to the effect described above, and may include any of the effects described in the present disclosure.

MODES FOR CARRYING OUT THE INVENTION

The following is a description of modes (hereinafter referred to as embodiments) for carrying out the present technology. Explanation will be made in the following order.
1. Structure of a Layered Imaging Device
2. Embodiment of Arrangement of Circuits on Respective Layers
3. Another Embodiments of Arrangement of Circuits on Respective Layers
4. Structure with a Reduced Number of Latches
5. Electronic Apparatus
6. Recording Medium <Structure of a Layered Imaging Device>

Figure 1:
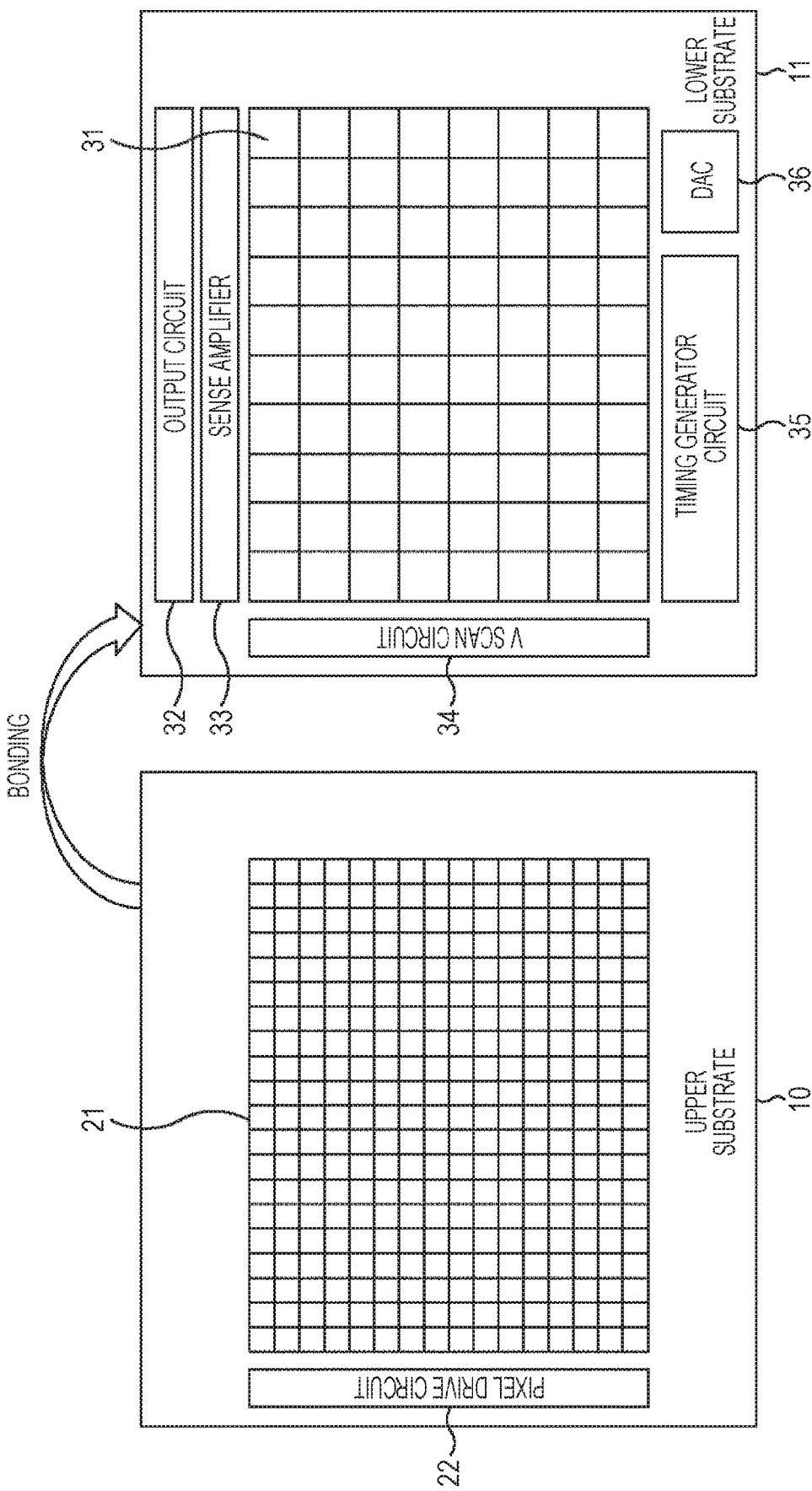
FIG. 1 is a diagram for explaining the structure of an imaging element.

FIG. 1 is a diagram showing the structure of an imaging device to which the present technology is applied. The present technology can be applied to a layered imaging device. In a layered imaging device, a chip having a signal processing circuit formed thereon, instead of a substrate supporting the portion of pixels, is used, and the pixel portion is overlapped on the chip. With this structure, the imaging device can be made smaller in size.

As shown in FIG. 1, on an upper substrate 10, pixels 21 are arranged in a matrix fashion, and a pixel drive circuit 22 for driving the respective pixels 21 is provided. On a lower substrate 11, A/D Converters (ADCs) 31 are arranged in a matrix fashion in the position corresponding to the pixels 21. In the example illustrated in FIG. 1, one block is formed with four (2×2) pixels, and one ADC 31 processes the four pixels 21 of one block. In such a structure, the ADCs 31 are made to operate in parallel, and each of the ADCs 31 performs AD conversion while scanning four pixels.

An output circuit 32, a sense amplifier 33, a V scan circuit 34, a timing generator circuit 35, and a D/A Converter (DAC) are also mounted on the lower substrate 11. Outputs from the ADCs 31 are output to the outside via the sense amplifier 33 and the output circuit 32. The processing related to reading from the pixels 21 is performed by the pixel drive circuit 22 and the V scan circuit 34, and is controlled by the timing generated by the timing generator circuit 35. The DAC 36 is also a circuit that generates a ramp signal.

Figure 2:
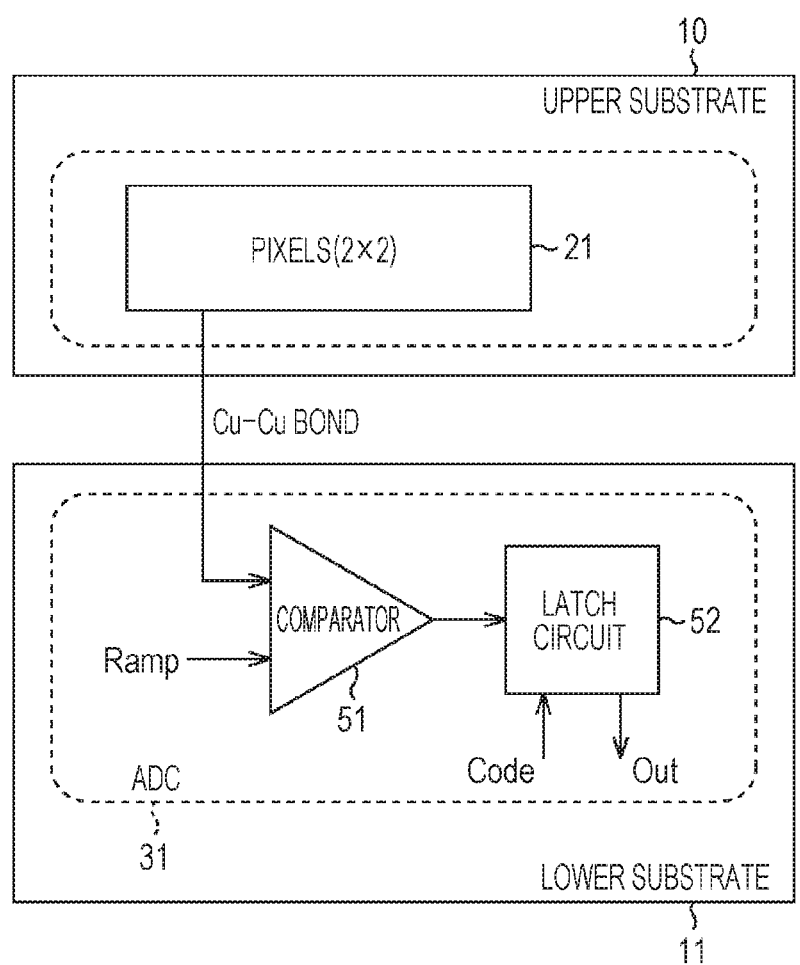
FIG. 2 is a diagram for explaining the circuits provided on an upper substrate and a lower substrate.

A ramp signal is a signal to be supplied to the comparators of the ADCs 31. Referring now to FIG. 2, the inner structure of each ADC 31 is described. FIG. 2 is a block diagram showing the structures of the pixels 21 of one block and an ADC 31. A signal from the pixels 21 of one block formed with four (2×2) pixels is compared with the ramp voltage of the ramp signal by the comparator 51 of the ADC 31.

The ramp voltage is a voltage that becomes gradually lower from a predetermined voltage. When the ramp voltage starts dropping, and a signal from the pixels 21 crosses the ramp voltage (when the voltage of the signal from the pixels 21 becomes equal to the ramp voltage), the output of the comparator 51 is inverted. The output of the comparator 51 is input to a latch circuit 52. A code value indicating the time at that moment is input to the latch circuit 52, and the code value generated by inverting the output of the comparator 51 is saved and is later read out.

Figure 3:
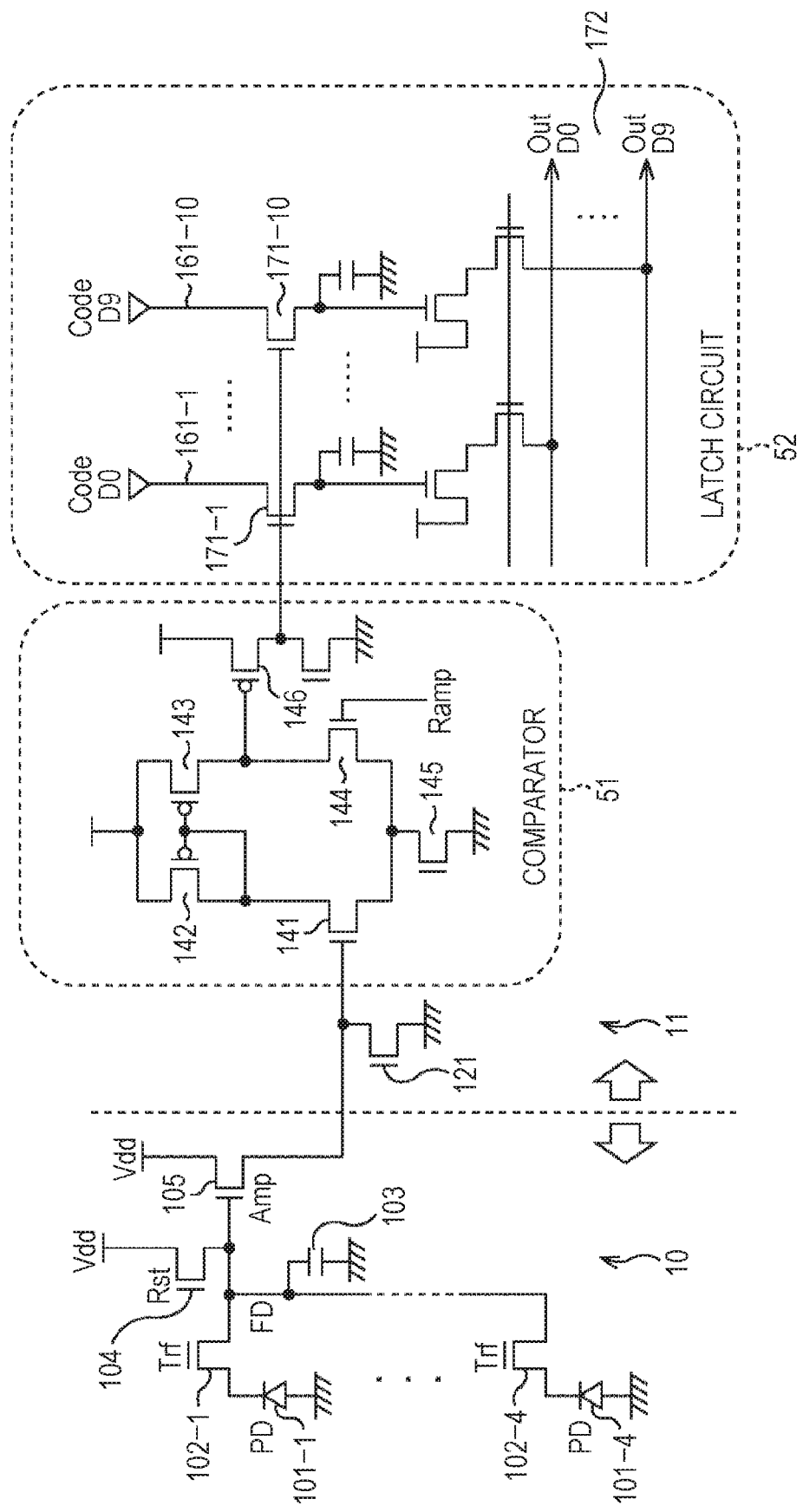
FIG. 3 is a diagram showing the circuit configuration of an imaging element.

FIG. 3 is a circuit diagram of the imaging device including the ADCs 31. FIG. 3 shows the respective circuits included in the upper substrate 10 and the lower substrate 11 shown in FIG. 1. The upper substrate 10 includes the pixels 21, and the circuit thereof has the structure shown on the left side of FIG. 3. Here, a structure in which four pixels share one floating diffusion (FD) is described as an example.

Photodiodes (PD) 101-1 through 101-4 as photoelectric conversion units are connected to transfer transistors (Trf) 102-1 through 102-4, respectively. Hereinafter, when there is no need to distinguish the photodiodes 101-1 through 101-4 from one another, the photodiodes 101-1 through 101-4 will be referred to simply as the photodiodes 101. Other components will be referred to in the same manner.

Each of the transfer transistors 102-1 through 102-4 is connected to a floating diffusion (FD) 103. The transfer transistors 102 transfer accumulated signal charge that has been photoelectrically converted by the photodiodes 101 to the floating diffusion 103 when a transfer pulse is provided.

The floating diffusion 103 functions as the charge-voltage conversion unit that converts the signal charge to a voltage signal. A reset transistor (Rst) 104 has its drain electrode connected to a pixel power supply of a power-supply voltage Vdd, and has its source electrode connected to the floating diffusion 103. Prior to the transfer of the signal charge from the photodiodes 101 to the floating diffusion 103, the reset transistor 104 supplies a reset pulse RST to the gate electrode, and resets the voltage of the floating diffusion 103 to a reset voltage.

An amplifying transistor (Amp) 105 has its gate electrode connected to the floating diffusion 103, and has its drain electrode connected to a pixel power supply of the power-supply voltage Vdd. The voltage of the floating diffusion 103 after being reset by the reset transistor 104 is output as the reset level, and the voltage of the floating diffusion 103 after the signal charge is transferred by the transfer transistors 102 is further output as the signal level.

The combination of the amplifying transistor 105 and a load MOS 121 provided on the lower substrate 11 functions as a source follower, and transfers an analog signal indicating the voltage of the floating diffusion 103 to the comparator 51 of the lower substrate 11.

The comparator 51 can be formed with a differential amplifier circuit. The comparator 51 includes a differential transistor pair unit including transistors 141 and 144, a load transistor pair unit that includes transistors 142 and 143 serving as output loads for the differential transistor pair unit and are located on the power supply side, and a current source unit 145 that supplies a constant operating current and is located on the ground (GND) side.

The respective sources of the transistors 141 and 144 are connected to the drain of the transistor of the current source unit 145, and the drains of the corresponding transistors 142 and 143 of the load transistor pair unit are connected to the respective drains (output terminals) of the transistors 141 and 144.

The output of the differential transistor pair unit (or the drain of the transistor 144 in the example illustrated in the drawing) is sufficiently amplified and is then output to the latch circuit 52 via a buffer 146.

A pixel signal transferred from the pixels 21 is supplied to the gate (input terminal) of the transistor 141, and a ramp signal is supplied from the DAC 36 to the gate (input terminal) of the transistor 144.

The latch circuit 52 is formed with ten latch columns 161-1 through 161-10. Codes D0 through D9 (hereinafter referred to as the code values D) are input to the latch columns 161-1 through 161-10, respectively. The code values D0 through D9 are code values indicating the time at that moment.

Each latch column 161 is a dynamic circuit, so as to reduce size. The output from the comparator 51 is input to the gates of transistors 171 that switch on and off the respective latch columns 161. The code value generated by inverting the output of the comparator 51 is saved in this latch circuit 52, is then read out, and is output to the sense amplifier 33 (FIG. 1).

In this structure, the pixels 21 are provided on the upper substrate 10, and the circuit is provided on the lower substrate 11. The upper substrate 10 and the lower substrate 11 can be joined by a Cu—Cu bond, for example. For this Cu—Cu bond, a technique disclosed in Japanese Patent: Application Laid-Open No. 2011-54637, filed by this applicant, can be used.

As the upper substrate 10 and the lower substrate 11 are to be stacked on each other, the upper substrate 10 and the lower substrate 11 preferably have almost the same size in principle. In other words, if one of the substrates is larger than the other, the size of the larger substrate becomes the upper limit size of the imaging device formed with the upper substrate 10 and the lower substrate 11.

The pixels 21 provided on the upper substrate 10 involve fewer transistors, and are easily made smaller in size. Of the lower substrate 11, the ADC 31, for example, involves a large number of transistors, and are not easily made smaller in size. If the same number of ADCs 31 as the number of the pixels 21 placed on the upper substrate 10 are placed on the lower substrate 11, there is a high possibility that the lower substrate 11 will become larger than the upper substrate 10. In view of this, one ADC 31 is shared by more than one pixel 21. In the example illustrated in FIG. 1, four pixels share one ADC 31.

In a case where one ADC 31 is shared by more than one pixel, control is performed so that signals from the pixels 21 (four pixels in this case) are read out while being switched. Therefore, if one ADC 31 handles a large number of pixels, the time lags among the pixels to be read become larger. Therefore, when a moving object is imaged, for example, the imaged object might be distorted, or it might take a long time to read one image.

For the above reasons, the ADCs 31 on the chip (the lower substrate 11 in this case) to be stacked on the pixels 21 are expected to be smaller in size as the pixels 21 become smaller in size. Also, the number of pixels to be handled by one ADC 31 is expected to become smaller when the chip is made smaller in size.

As shown in FIG. 3, the comparator 51 and the load MOS 121 are analog circuits, and might vary in performance. Therefore, in the background, it is difficult to make the transistors smaller or lower the voltage thereof. As the latch circuit 52 is a digital circuit, it is relatively easy to make the latch circuit 52 smaller in size or lower the voltage thereof.

As a large number of such small-sized digital circuits and analog circuits are arranged in the close vicinity of one another, it becomes difficult to optimize the power-supply voltage and the withstand voltage of the transistors. Also, the pixels 21 and the comparators 51 require a steady-state current, and therefore, it is not easy to reduce power consumption. Also, the pixels 21 generate outputs while allowing current to pass therethrough, and therefore, thermal noise is generated.

As described above, where the pixels 21 are simply placed on the upper substrate 10, and circuits are simply placed on the lower substrate 11, the above problems might occur.

<Embodiment of Arrangement of Circuits on the Respective Layers>

Figure 4:
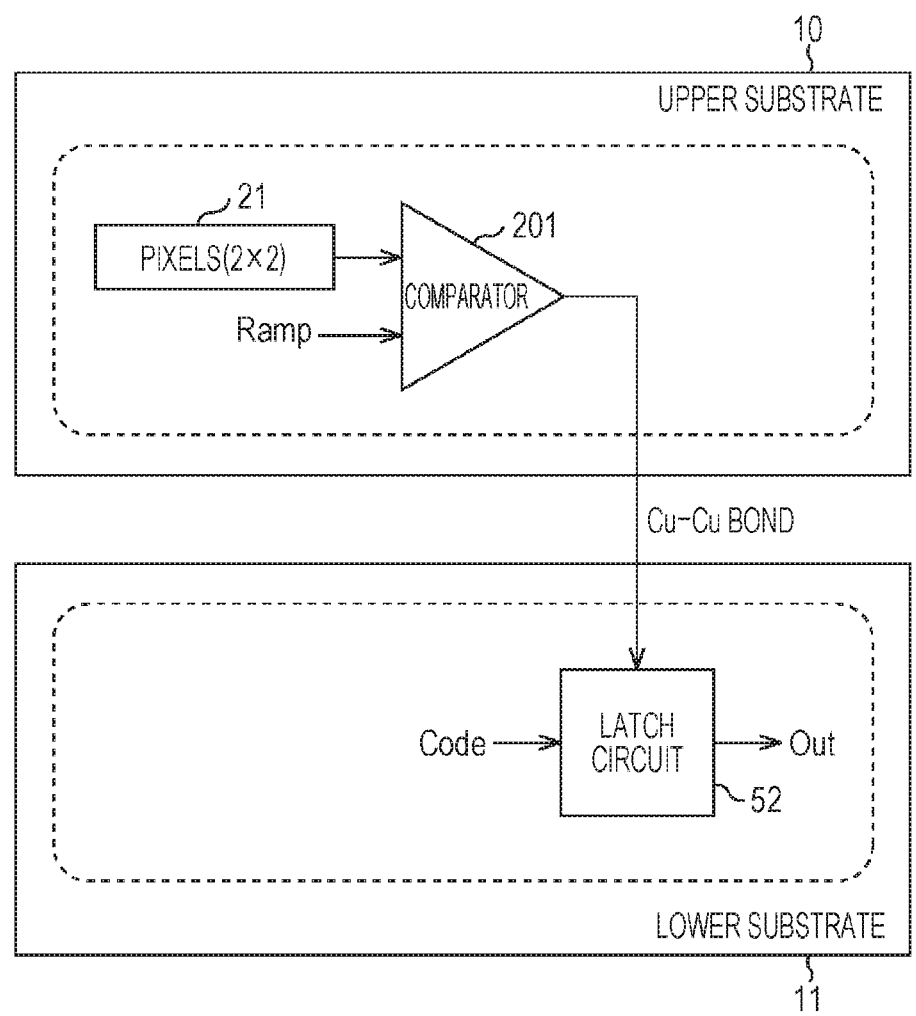
FIG. 4 is a diagram for explaining the circuits provided on an upper substrate and a lower substrate.

In view of the above, the structure shown in FIG. 4 is formed. The structure shown in FIG. 4 is equivalent to the structure shown in FIG. 2, and FIG. 4 is a block diagram showing a structure formed with the pixels 21 of one block and an ADC 31. In the structure shown in FIG. 4, the comparator and the latch circuit constituting the ADC 31 are separated and are placed on the upper substrate 10 and the lower substrate 11.

To be distinguished from the comparator shown in FIG. 2, the comparator placed on the upper substrate 10 is denoted by a different reference numeral, and will be hereinafter referred to as the comparator 201. As will be described later, the latch circuit 52 can have the same structure as the latch circuit 52 described above with reference to FIGS. 2 and 3, and therefore, the latch circuit 52 will be described below without a change in reference numeral.

As shown in FIG. 4, the pixels 21 and the comparator 201 are placed on the upper substrate 10, and a signal from the pixels 21 is compared with a ramp signal. A comparison result from the comparator 201 is supplied to the latch circuit 52 placed on the lower substrate 11. A code (Code) indicating time information is supplied to the latch circuit 52. The latch circuit 52 converts the signal from the pixels 21 into a digital signal, and outputs the digital signal to a later stage.

All the components constituting the comparator 201 may be placed on the upper substrate 10, or the main components of the comparator 201 may be placed on the substrate 10. The other components of the ADC 31 than the components placed on the upper substrate 10 are placed on the lower substrate 11.

As described above, the pixels 21 and the comparator 201 are placed on the upper substrate 10, and the latch circuit 52 is placed on the lower substrate 11. As described above, in the imaging device shown in FIG. 4, the pixels 21 and the ADC 31 are not placed on the upper substrate 10 and the lower substrate 11 in the same manner as the pixels 21 and the ADC 31 separated in the structure shown in FIG. 2. Instead, the ADC 31 is divided, and the divided portions are placed on the upper substrate 10 and the lower substrate 11.

Figure 5:
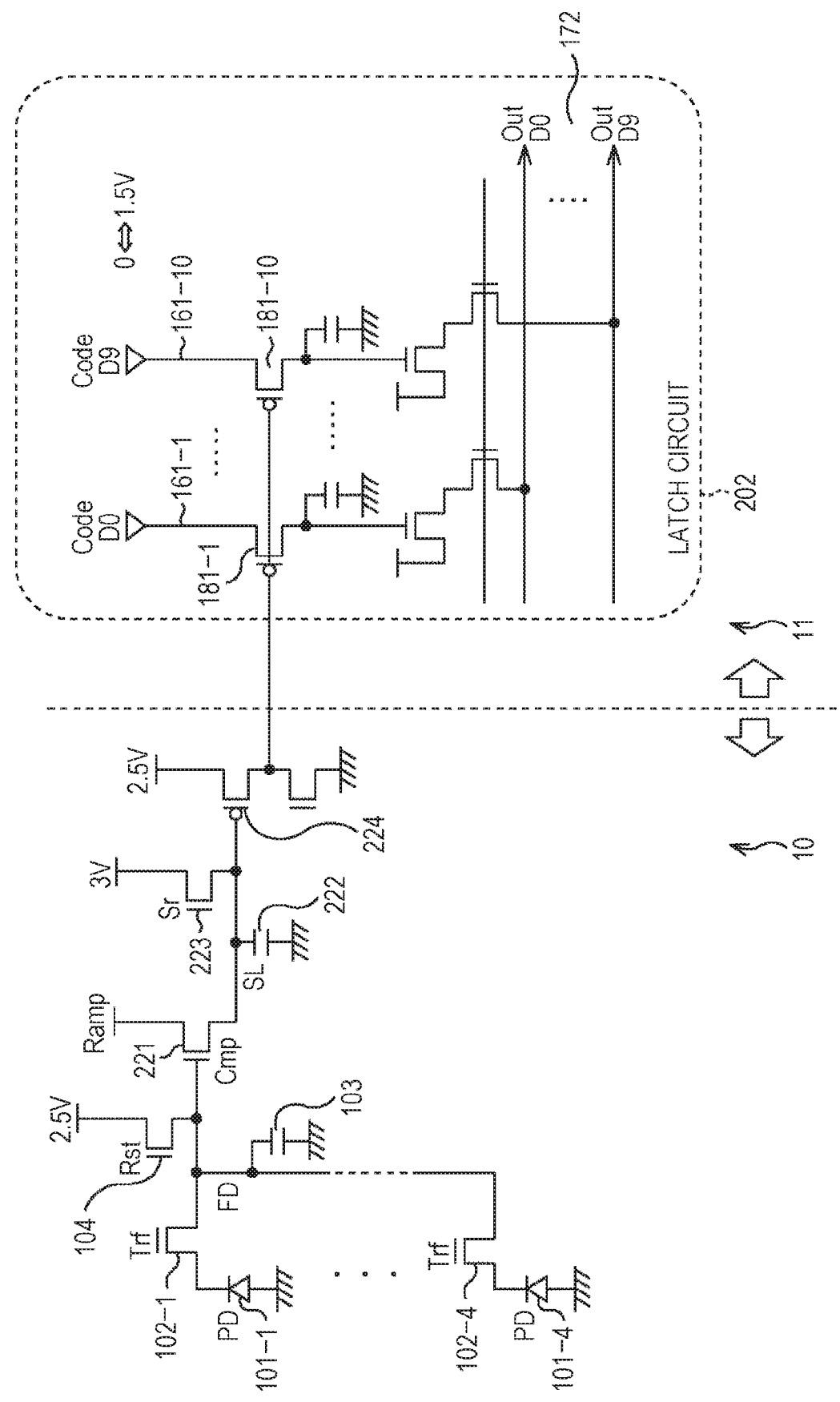
FIG. 5 is a diagram showing the circuit configuration of an imaging element.

FIG. 5 shows an example circuit configuration of an imaging device corresponding to FIG. 4. In the example circuit configuration shown in FIG. 5, the same components as those in the example circuit configuration shown in FIG. 3 are denoted by the same reference numerals as those used in FIG. 3, and explanation of them will not be repeated below. As described above, the structures of the pixels 21 and the latch circuit 52 are the same as those in the circuit configuration shown in FIG. 3, and the circuit portion equivalent to the comparator 201 differs from that shown in FIG. 3.

In the circuit configuration shown in FIG. 3, the voltage signal of the floating diffusion 103 is supplied to the amplifying transistor 105. In the circuit configuration shown in FIG. 5, however, the voltage signal of the floating diffusion 103 is applied to a comparing transistor (Cmp) 221.

That is, in the circuit configuration shown in FIG. 5, the floating diffusion 103 is connected to the gate of the comparing transistor (Cmp) 221. The comparing transistor 221 performs not a source follower operation but a voltage value comparing operation. One of the main electrodes of the comparing transistor 221 is connected not to the power-supply voltage but to the ramp (Ramp) signal line, and the other one of the main electrodes is connected to the gate of a buffer 224 through a signal line (SL).

An SL 222 has a parasitic capacitance and a capacitative element depending on the structure. An Sr 223 will be described as a transistor that resets the SL222 to a predetermined voltage, such as 3 V. The output from the buffer 224 is supplied to the latch circuit 52 of the lower substrate 11 joined thereto by a Cu—Cu bond, for example.

On the side of the lower substrate 11, the latch circuit 52 including latch columns 161-1 through 161-10 is provided. The output from the buffer 224 is input to the gates of transistors 181 that switch on and off the latch circuit 52. The structure of the latch circuit 202 is the same as the latch circuit 52 shown in FIG. 3, and performs the same processing as the latch circuit 52. However, the latch circuit 202 differs from the latch circuit 52 in that the transistors 131 are formed with Positive channel Metal Oxide Semiconductors (PMOSs).

As described above, in the circuit configuration shown in FIG. 5, the structure of the comparator 51 is simpler than that in the circuit configuration shown in FIG. 3. Also, the load MOS 121 is not included. The comparator 51 and the load MOS 121 shown in FIG. 3 are analog circuits, and might vary in performance. Therefore, it is difficult to make the transistors smaller or lower the voltage thereof in the background.

On the other hand, the comparator 51 shown in FIG. 5 does not use a differential amplifier circuit, but is formed with the comparing transistor 221. Accordingly, the structure of the comparator 51 is simplified. Also, in the circuit configuration shown in FIG. 5, the load MOS 121 is eliminated. In this configuration, the number of transistors can be reduced, and the structure of the comparator 201 can be made smaller in size.

A mechanism for digitizing the voltage of the floating diffusion 103 in the circuit configuration shown in FIG. 5 is now described.

First, a pulse is input to the Sr 223, and the SL 222 is reset to 3 V. With this serving as a trigger, the buffer 224 outputs the low level (0 V). Since the output from the buffer 224 is low, the PMOSs (the transistors 181) of the latch columns 161 are switched on, and the code values D0 through D9 indicating time are supplied to the capacitative elements of the latch columns 161.

Figure 6:
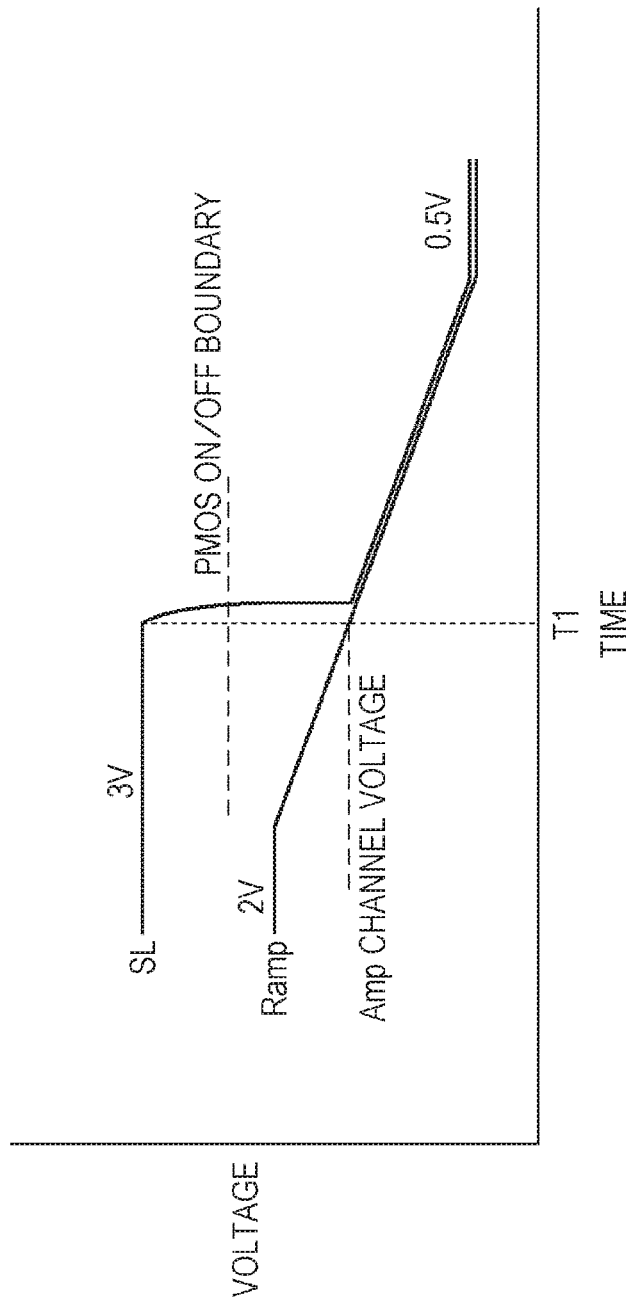
FIG. 6 is a diagram for explaining a time when a comparing transistor is inverted.

FIG. 6 shows the variations in the ramp voltage and the SL signal of the SL 222 when the ramp voltage gradually drops from 2 V. When the ramp voltage (the solid line denoted by "Ramp" in the drawing) crosses the channel voltage from the comparing transistor 221 (the dashed line denoted by "Amp CHANNEL VOLTAGE" in the drawing) (time T1), the comparing transistor 221 becomes conductive.

As the comparing transistor 221 becomes conductive, the voltage of the SL 222 (the solid line denoted by "SL" in the drawing) rapidly drops to the voltage equal to the ramp voltage. As a result, the PMOS on/off boundary of the buffer 224 is crossed, and the buffer 224 is inverted to the High level.

The PMOSs (the transistors 181) of the latch columns 161 are then switched off, and the latch capacitances are cut off from the code signal, and the values at that point (the respective values of the codes D0 through D9) are saved. Through such a process, the voltage of the floating diffusion 103 is digitized.

Figure 7:
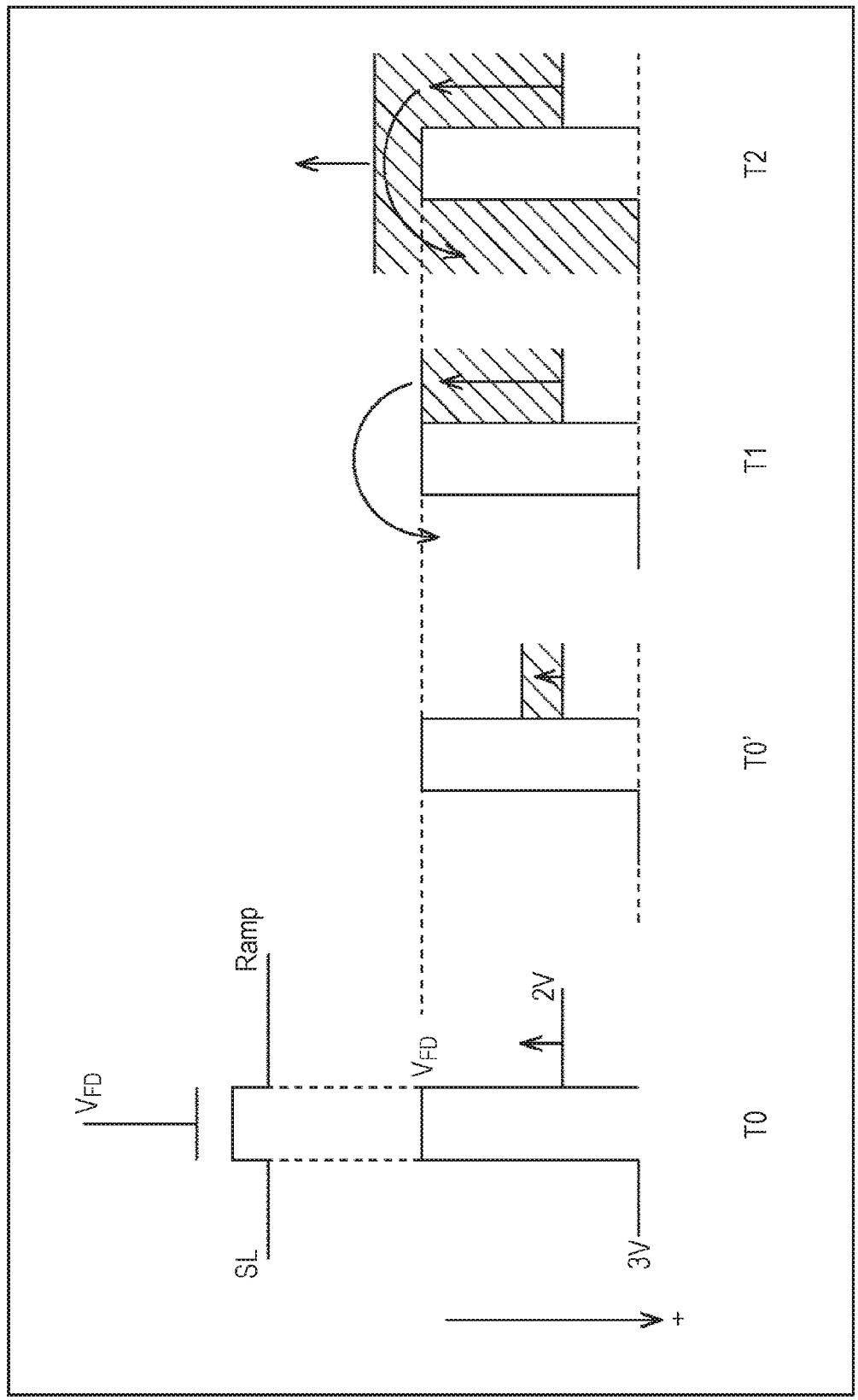
FIG. 7 is a diagram for explaining a time when the comparing transistor is inverted.

Referring now to FIG. 7, variations in the ramp voltage and the SL signal of the SL 222 are again described. The upper portion of FIG. 7 is a diagram showing the comparing transistor 221 (Cmp 221), and the lower portion of FIG. 7 is a diagram showing potentials. At time T0, the ramp (Ramp) voltage is 2 V, and the voltage of the SL 222 is 3 V. The downward direct ion in FIG. 7 is the positive direction. The Amp channel voltage is denoted by "VFD" in FIG. 7.

The ramp voltage starts becoming gradually lower at time T0. Time T0' is a time when time T0<time T0'<time T1 is satisfied. At time T0', the ramp voltage is still higher than the channel voltage (VFD) from the comparing transistor 221 (or is low in potential in the state shown in FIG. 7), and therefore, the voltage of the SL 222 remains 3 V.

At time T1, the ramp voltage and the Amp channel voltage (VFD) become the same (or have the same potential). After time T1, the potential of the ramp voltage is higher than the potential of the Amp channel voltage (VFD), and therefore, electrons rapidly flow toward the side of the SL 222. After that, as shown as time T2, the potential of the ramp voltage and the potential of the SL 222 become higher by the same amount. In other words, the voltage of the SL 222 drops in the same manner as the ramp voltage.

As the potentials change in the above manner, the voltage relationship is as shown in FIG. 6. The comparing transistor 221 can detect the time when the ramp voltage and the Amp channel voltage become substantially the same. When the ramp voltage and the Amp channel voltage become substantially the same, the comparing transistor 221 becomes conductive as described above, the PMOS on/off boundary of the buffer 224 is crossed, and the buffer 224 is inverted to the high level.

Such an operation is performed simultaneously in all the ADCs 31. After that, the latched signals are sequentially read into the sense amplifier 33 row by row. The signals are then output from the sense amplifier 33 via the output circuit 32.

With the structures shown in FIGS. 4 and 5, and through the operation described above with reference to FIG. 6, the size of the comparator 201 is greatly reduced. At the same time as being made smaller in size, the comparator 201 is placed on the upper substrate 10.

As the upper substrate 10 and the lower substrate 11 are connected by the output of the buffer 224, the upper substrate 10 can be a 3 V system, and the lower substrate 11 can be a 1.5V system. As the upper substrate 10 and the lower substrate 11 are driven with different voltages from each other as described above, the power supplies to the upper substrate 10 and the lower substrate 11 can be separated from each other. Also, the manufacturing processes for the upper substrate 10 and the lower substrate 11 can be optimized separately from each other.

Furthermore, the upper substrate 10 can be designed to accommodate analog circuits, and the lower substrate 11 can be designed to accommodate digital circuits. Accordingly, small analog circuits and small digital circuits can be prevented from coexisting in the vicinity of one another. As a result, the analog-digital boundary region can be eliminated, and the structure can be made smaller in size. Also, as any unnecessary situation where different power supplies are provided in a confusing manner can be avoided, the structure can be made smaller in size.

Although specific voltages such as 1.5V, 2.5 V, and 3 V are shown in FIG. 5, those voltages are mere examples, and do not limit the present technology. In the description below, specific voltages will also be mentioned as examples, but will not limit the present technology in any way.

Meanwhile, the power supply on the drain side of the Sr 223 is preferably higher than the power supply for the buffer 224. In FIG. 5, the power supply for the Sr 223 is 3 V, and the power supply for the buffer 224 is 2.5 V, for example. The reason for that is as follows. The SL 222 is floating, and therefore, the voltage thereof varies with time. However, as the voltage of the SL 222 is set higher than the power supply for the buffer 224, the margin of the off-state of the PMOSs can be obtained.

The gate voltage of the Sr 223 may be boosted, or the Sr 223 may be formed with a transistor of a depression type, so as to form a structure that passes 3 V. Although not shown in the drawings, the Sr 223 may be formed with a PMOS transistor, so as to increase the threshold value or boost the gate voltage in the off-state.

By another method of obtaining a margin of the off-state of the PMOSs, a capacitive element may be provided to the SL 222, so that variation in the voltage of the SL 222 can be restrained by dark current.

The power supply for the reset drains of the pixels 21, the reset threshold value, and the threshold value of the comparing transistor 221 are preferably designed so as to satisfy the conditions described below.

The voltage of the floating diffusion 103 after reset is set at such a voltage that the charges to be transferred from the photodiodes 101 can be received. Also, the voltage of the floating diffusion 103 after reset (or the gate voltage of the comparing transistor 221) is set at such a voltage that the comparing transistor 221 can be switched off when the ramp voltage is the initial voltage of 2 V.

The power supply for the latch circuit 52 is preferably lower than the buffer 224. This is because the latch capacitances can be certainly cut off from the code (Code) signals when the PMOS transistor is switched off. In a case where the areas of the photodiodes 101 of the pixels 21 are to be maximized, the upper substrate 10 and the lower substrate 11 may be connected by the SL 222, and the buffer 224 and the Sr 223 may be placed on the lower substrate 11.

<Another Embodiments of Arrangement of Circuits on Respective Layers>

Figure 8:
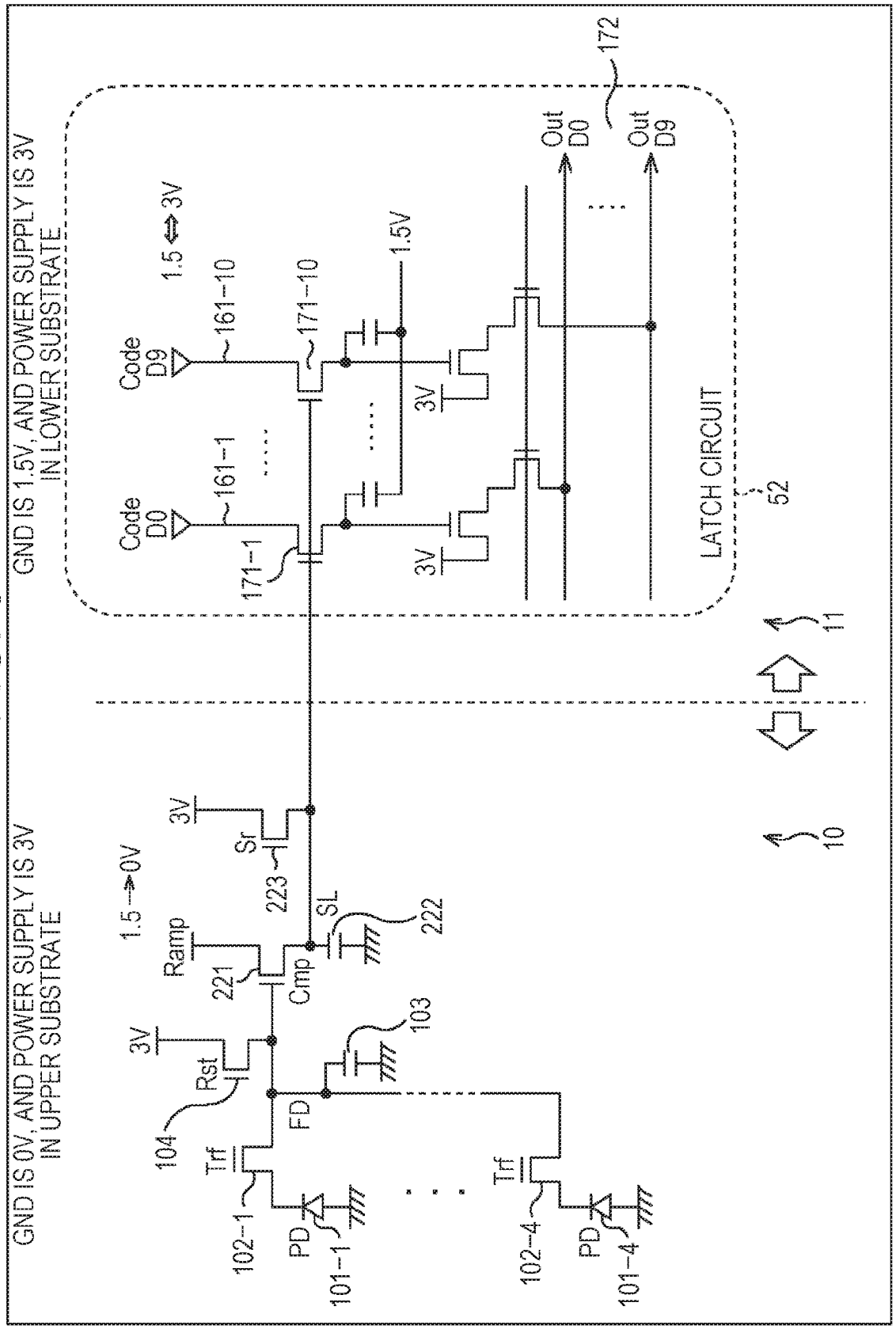
FIG. 8 is a diagram showing the circuit configuration of an imaging element.

FIG. 8 shows an example circuit configuration of another embodiment of arrangement of circuits on the respective layers for further reducing the size of an imaging device. The same components as those shown in FIG. 5 are denoted by the same reference numerals as those used in FIG. 5, and explanation thereof will not be repeated below. In the circuit configuration shown in FIG. 8, all circuits are formed with NMOSs (Negative channel Metal Oxide Semiconductors), and the operating points are adjusted accordingly.

In the circuit configuration shown in FIG. 8, the upper substrate 10 basically has a low power supply of 0 V and a high power supply of 3 V, and the lower substrate 11 basically has a low power supply of 1.5 V and a high power supply of 3 V. That is, the high power supply sides of the upper substrate 10 and the lower substrate 11 have a common voltage.

In the lower substrate 11, the only portion corresponding to the pixels 21 is the latch circuit 52. The circuits placed on the upper substrate 10 and the latch circuit 52 placed on the lower substrate 11 are all formed with NMOSs. As all the circuits are formed with NMOSs, the buffer 224 required in the circuit configuration shown in FIG. 5 can be eliminated. The Sr 223 is placed on the upper substrate 10 in the example shown in FIG. 8.

The operation to be performed in the circuit configuration shown in FIG. 8 is basically the same as the operation to be performed in the circuit configuration shown in FIG. 5. First, a pulse is input to the Sr 223, and the SL 222 is reset to 3 V. In this state, the transistors 181 of the latch columns 161 are switched on, and the code values D0 through D9 indicating time are supplied to the capacitive elements of the latch columns 161.

The ramp voltage is then lowered gradually from 1.5 V. This case differs from the circuit configuration shown in FIG. 5 in that the ramp voltage starts from 1.5 V, instead of 2 V. When the ramp voltage crosses the channel voltage of the comparing transistor 221, the comparing transistor 221 becomes conductive. The voltage of the SL 222 is rapidly lowered so as to be equal to the ramp voltage. The latch columns 161 are switched off, the latch capacitances are cut off from the code signals, and the values at that point are saved.

Only the gates of the transistors 171 connected to the pixels of the latch columns 161 become lower than 1.5 V (the low power supply for the lower substrate 11). Accordingly, the latch columns 161 can be certainly switched off, and the signals can be saved. Therefore, the insulating films of the respective gates of the transistors 171-1 through 171-10 included in the latch columns 161 are preferably thick and have a high withstand voltage.

With the circuit configuration shown in FIG. 8, the voltage margin is narrower than that with the circuit configuration shown in FIG. 5, but the size of an imaging device can be further reduced.

The amplifying transistor 105 in the circuit configuration shown in FIG. 3 outputs a signal while allowing current to pass therethrough. Therefore, power consumption becomes larger. In the circuit configuration shown in FIG. 5 or 8, however, no steady-state current is required in obtaining an output from the comparing transistor 221. Accordingly, smaller power consumption can be realized.

Since the amplifying transistor 105 outputs a signal while allowing current to pass therethrough, there is a high possibility that thermal noise is generated. In the circuit configuration shown in FIG. 5 or 8, however, the comparing transistor 221 does not allow current to pass therethrough, no thermal noise is generated. Accordingly, influence of thermal noise can be reduced.

The Signal Line (SL) 222 is floating, and therefore, a change in voltage is caused by dark current at defective pixels. In view of this, the SL 222 may be drawn to the power-supply side with a very small current, so as not to be floating.

Figure 9:
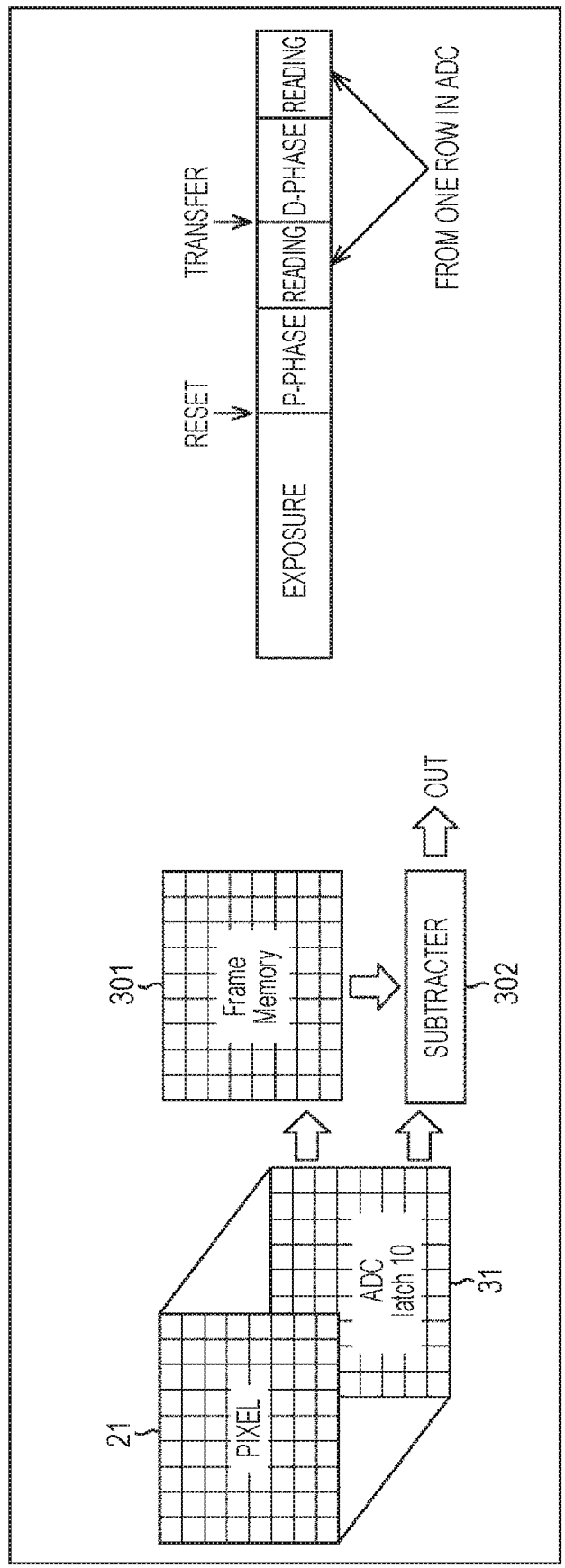
FIG. 9 is a diagram for explaining a read operation.
Figure 10:
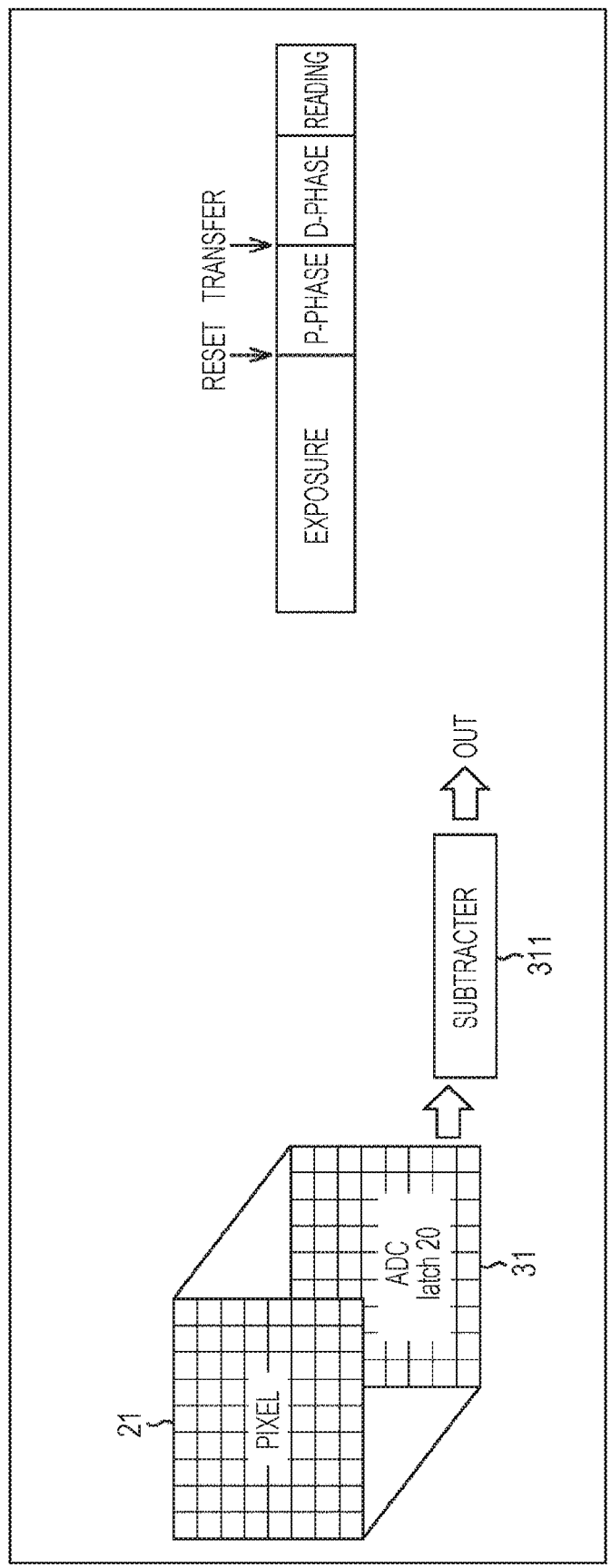
FIG. 10 is a diagram for explaining a read operation.

Referring now to FIGS. 9 and 10, processes related to reading are additionally described. In FIGS. 9 and 10, one ADC 31 is provided to one pixel, for ease of explanation.

As the present technology is applied, the ADCs 31 can be made smaller in size. Even where one ADC 31 is provided for one pixel, both of the upper substrate 10 and the lower substrate 11 can be made smaller in size. Accordingly, it is possible to form a structure in which one ADC 31 is provided for one pixel. In view of this, in the description below, one ADC 31 is provided for one pixel.

As described above with reference to FIG. 5 or 8, each ADC 31 is divided and is placed on the upper substrate 10 and the lower substrate 11. In the examples shown in FIGS. 9 and 10, portions placed on the upper substrate 10 and the lower substrate 11 are collectively referred to as ADCs 31.

The thick arrows in FIGS. 9 and 10 indicate the flows of signals. The diagram shown on the left side in FIG. 9 shows a case where AD conversion involves 10 bits, and ten latch columns 161 are provided. The diagram shown on the right side indicates the order of reading in such a case.

In a pixel 21, a reset operation is performed by a reset transistor 104, and a transfer operation is performed by a transfer transistor 102. In the reset operation, the voltage of a floating diffusion 103 when being reset by the reset transistor 104 is output as a reset component (P-phase) from the pixel 21 to a vertical signal line (not shown).

In the transfer operation, the voltage of the floating diffusion 103 at the time when the charge accumulated in the photodiode 101 is transferred by the transfer transistor 102 is output, as a signal component (D-phase) to the vertical signal line.

As such reading is performed, exposure is first conducted, as shown in the right diagram in FIG. 9. After the exposure, the floating diffusion 103 is reset, and the level thereof is subjected to AD conversion (P-phase period). During the P-phase period, a value that is output from the a latch circuit 261 (FIG. 5 or 8) is read from one row in the ADC 31 at a time, and is stored into a frame memory 301.

After the P-phase period, the photoelectrons of the photodiode 101 are transferred to the floating diffusion 103, and the level thereof is subjected to AD conversion (D-phase period). During the D-phase period, the value that is output from the latch circuit 261 (FIG. 5 or 8) is read from one row in the ADC 31 at a time, and is supplied to a subtracter 302.

The subtracter 302 subtracts the value read during the D-phase period from the value that has been read during the P-phase period and is stored in the frame memory 301. In this manner, a signal is obtained. This exposure, the P-phase, and the D-phase are conducted simultaneously at all the pixels.

In a case where one ADC 31 is assigned to more than one pixel 21, "P-phase, reading, D-phase, and reading" are performed in this order on one pixel at a time.

The diagram shown on the left side in FIG. 10 shows a case where AD conversion involves 10 bits, and 20 latch columns 161 are provided. The diagram shown on the right side is a diagram showing the order of reading in such a case. As the 20 latch columns 161 are provided, a 10-bit value of the P-phase period and a 10-bit value of the D-phase period can be saved.

In a case where the ADCs 31 have both latches for the P-phase and latches for the D-phase as described above, the frame memory 301 can be eliminated, and the process of transferring values from the ADCs 31 to the frame memory 301 can be skipped.

In the structure shown in FIG. 10, the floating diffusion 103 is reset after exposure, and the level thereof is subjected to AD conversion (P-phase period), and the value is saved in the latch for the P-phase. When the next timing comes, the photoelectrons of the photodiode 101 are transferred to the floating diffusion 103, and the level thereof is subjected to AD conversion (D-phase period) and is saved in the latch for the D-phase.

The values saved in the latch for the P-phase and the latch for the D-phase are read from one row of the ADC 31 at a time. Subtraction is performed at a subtracter 311, and a signal is output.

In this manner, reading from the ADCs 31 is performed. The imaging device, the frame memory 301, and the subtracter 302 (or 311) may be integrated, or may be formed as different chips from one another.

In the above described embodiment, the pixels 21 and the ADCs 31 have been mainly described. However, circuits other than the ADCs 31 may be included, and a digital process for latched data may be performed, for example.

In the above described embodiment, all the NMOSs may be replaced with PMOSs. In such a case, operation can be performed with an inverted voltage.

<Structure with a Reduced Number of Latches>

In the above described embodiments, the comparator 201 and the latch circuit 52 included in an ADC 31 are placed on the upper substrate 10 and the lower substrate 11, respectively, and the comparator 201 is formed with the comparing transistor 221, for example.

Next, a case where the size of the latch circuit 52 is reduced by reducing the number of the latch columns 161 in the latch circuit 52 is described.

Figure 11:
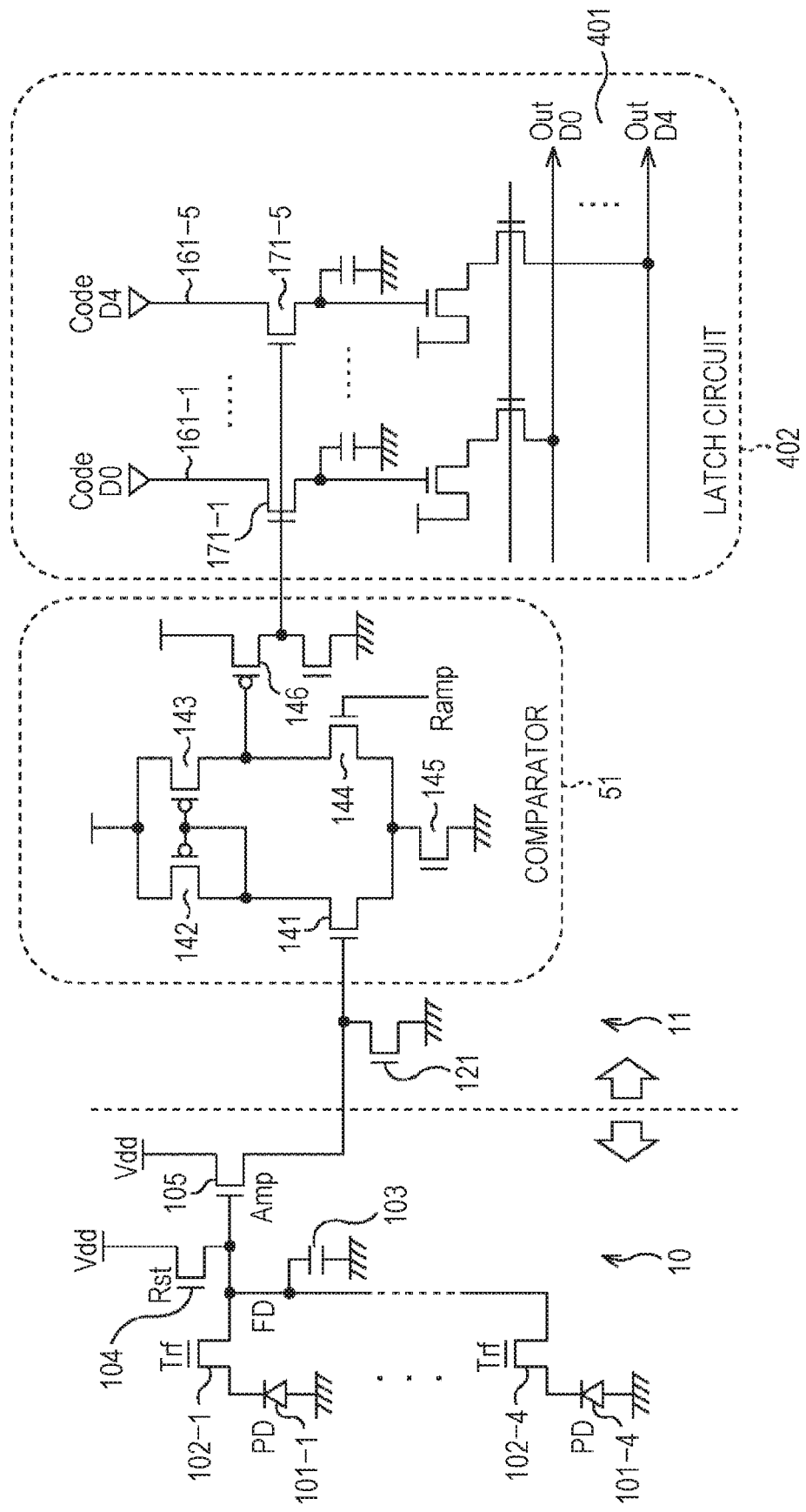
FIG. 11 is a diagram showing the circuit configuration of an imaging element.

FIG. 11 is a diagram showing the circuit configuration of an imaging device. A comparison between the circuit configuration of the imaging device shown in FIG. 3 and the circuit configuration shown in FIG. 11 shows that the structure of a latch circuit 402 differs from the structure of the latch circuit 52. The latch circuit 52 shown in FIG. 3 includes the ten latch columns 161 of the latch columns 161-1 through 161-10. On the other hand, the latch circuit 402 shown in FIG. 11 includes the five latch columns 161 of latch columns 161-1 through 161-5.

In this example case, the number of latch columns 161 is halved from ten to five. In a case where the number of latch columns 161 is reduced as described above, the process described below is performed so that a 10-bit value can be obtained just as in a case where ten latch columns 161 are included.

Figure 12:
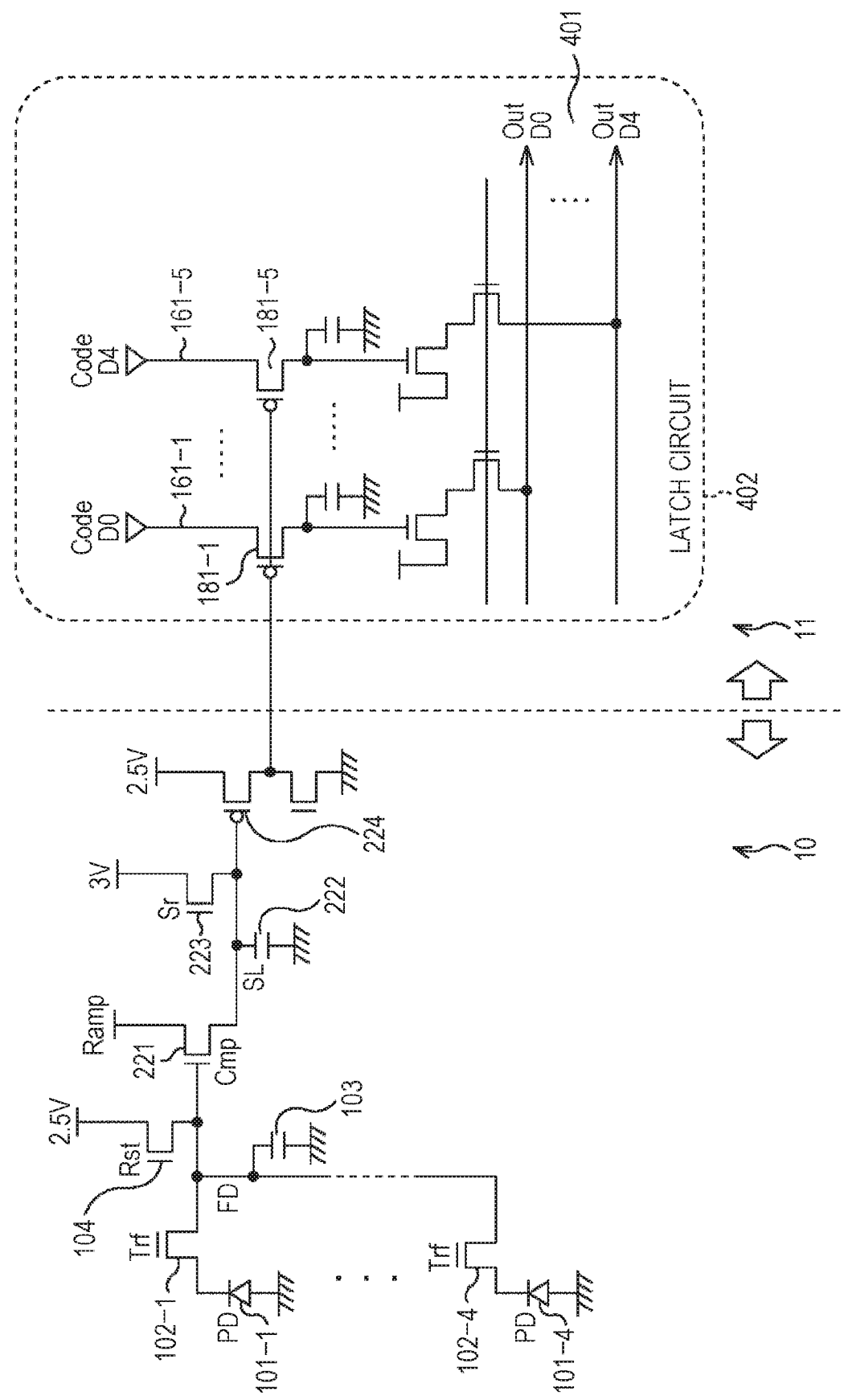
FIG. 12 is a diagram showing the circuit configuration of an imaging element.

The number of latch columns 161 in the circuit configuration shown in FIG. 11 is smaller than that in the circuit configuration shown in FIG. 3. However, it is possible to employ a circuit configuration with a smaller number of latch columns 161 than that in the circuit configuration shown in FIG. 5 or 8. FIG. 12 is a diagram showing a circuit configuration including a smaller number of latch columns 161 than that in the circuit configuration shown in FIG. 5.

A comparison between the circuit configuration of the imaging device shown in FIG. 5 and the circuit configuration shown in FIG. 12 shows that the structure of the latch circuit 402 differs from the structure of the latch circuit 202. The latch circuit 202 shown in FIG. 5 includes the ten latch columns 161 of the latch columns 161-1 through 161-10. On the other hand, the latch circuit 402 shown in FIG. 12 includes the five latch columns 161 of latch columns 161-1 through 161-5.

Although not shown in a drawing, in the circuit configuration of the imaging device shown in FIG. 8, the process described below may be performed so that the number of latch columns 161 included in the latch circuit 202 can be reduced.

The structures other than the latch circuit 402 can be the same as the structures in the circuit configuration shown in FIG. 3, 5, or 8, and explanation of the components having the same structures as those in the circuit configuration shown in FIG. 3, 5, or 8 will not be repeated below. In the description below, explanation with reference to the circuit configuration shown in FIG. 11 is continued.

In the case of the circuit configuration shown in FIG. 11, the output from the comparator 51 is input to the gates of transistors 171 that switch on and off the latch circuit 402. As the latch circuit 402 includes the five latch columns 161-1 through 161-5, there are five bits, and code values D0 through D4 with high or low voltages are input thereto.

When the output of the comparator 51 is high, the latch circuit 402 is switched on, and the code values D0 through D4 are input to the latch capacitances. When the output of the comparator 51 is low, the latch circuit 402 is switched off, and the code values D0 through D4 are not input to the latch capacitances. The high/low voltages of the latch capacitances are output as Out D0 through D4 (hereinafter referred to as the outputs D0 through D4) from a lower output stage 401 to the sense amplifier 33 of the next stage (FIG. 1).

Figure 13:
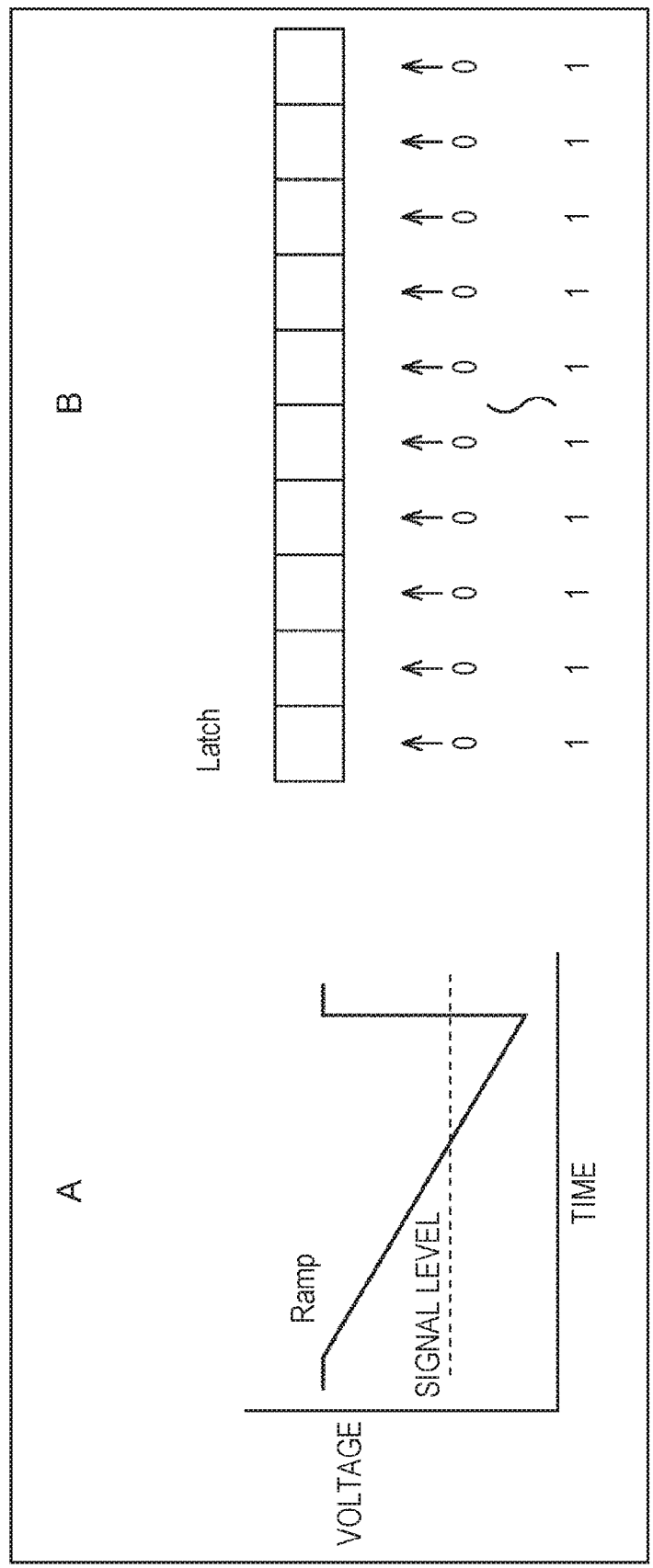
FIG. 13 is a diagram for explaining a read operation.

In such a structure, the basic operation is the same as the operation described above. Specifically, a ramp signal shown in A in FIG. 13 is input to the comparator 51. The ramp signal (the solid line denoted by "Ramp") is a signal that has a voltage gradually dropping with time.

In a case where the ramp voltage of the ramp signal that is input to the comparator 51 is higher than the voltage of the signal (the dashed line denoted by "SIGNAL LEVEL" in A in FIG. 13) that is input from the side of the pixels 21 via a signal line, the output from the comparator 51 is high, and the latch circuit 402 is switched on. When the latch circuit 402 is in the on-state, the code values D0 through D4 that are incremented with time are supplied to the latch capacitances of the respective latch columns 161-1 through 161-4.

When the ramp voltage drops gradually and becomes lower than the voltage of the signal line, the output of the comparator 51 is inverted, and the latch circuit 402 is switched off. The code values at the time when the latch circuit 402 is switched off are saved in the latch capacitances. In this manner, the output of the pixels 21 is digitized.

The process at the latch circuit 402 is performed in the above manner. Referring back to FIG. 3, explanation is continued. In a case where the ten latches of the latch columns 161-1 through 161-10 are provided as in the latch circuit 52 shown in FIG. 3, 10-bit values "0000000000" through "1111111111" are output as shown in B in FIG. 13.

That is, where ten latch columns 161 are provided, and the ramp voltage is compared with a signal from pixels as shown in A in FIG. 13, the code values D0 through D9 that are incremented from "0000000000" to "1111111111" are input to the latches representing 10 bits. When the relationship between the ramp voltage and the signal voltage is reversed, the latches are cut off from the code values, and the values at that moment are saved. Accordingly, the saved values are simply read out when the signal level is detected.

Meanwhile, the latch circuit 402 differs from the latch circuit 52 in that the number of latch columns 161 is halved and is reduced to five. Therefore, if the ramp signal shown in A in FIG. 13 is used, and the same process as above is performed in this case, a 5-bit value is obtained, but a 10-bit value is not obtained. In view of this, a ramp signal shown in A in FIG. 14 is used.

Figure 14:
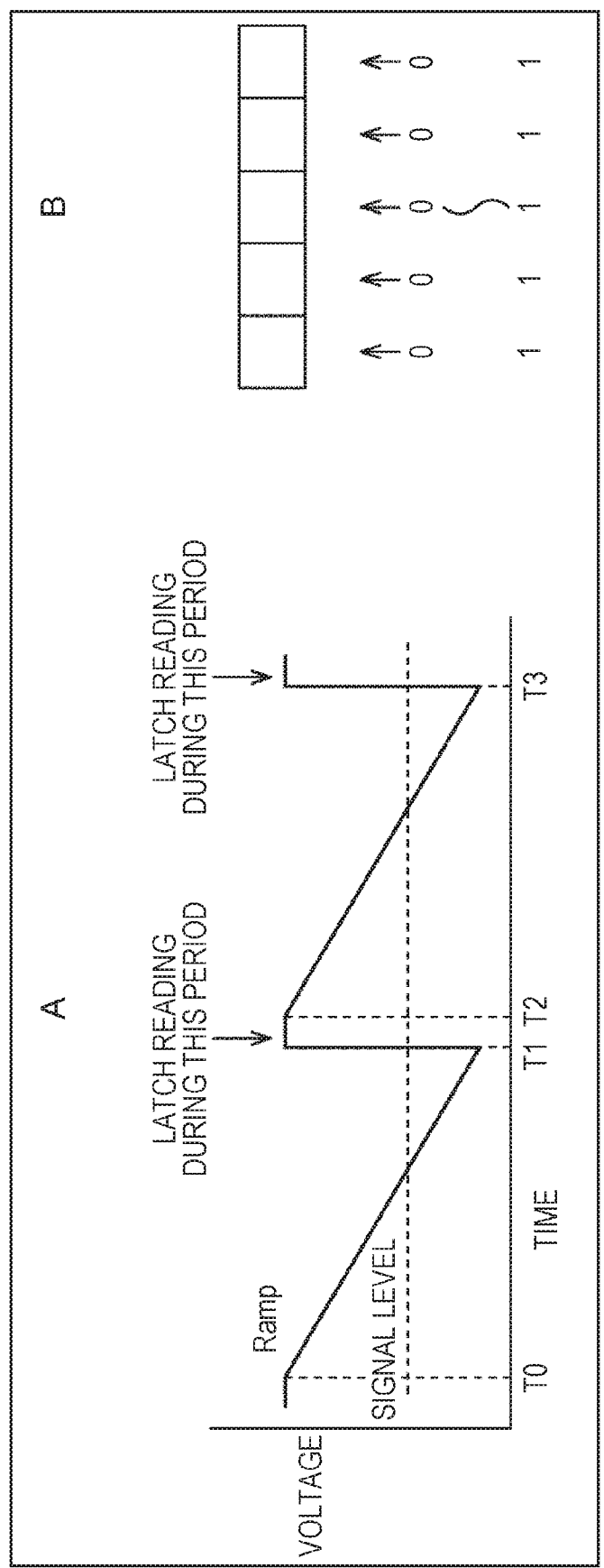
FIG. 14 is a diagram for explaining a read operation.

The ramp signal shown in A in FIG. 14 is a signal that has two ramps so as to obtain a 10-bit value. Hereinafter, the ramp signal from time T0 to time T1 will be referred to as the first ramp, and the ramp signal from time T2 to time T3 will be referred to as the second ramp.

The first ramp to be output between time T1 and time T2 is a ramp for obtaining a lower 5-bit output value formed with lower five bits serving as code values. For the lower five bits, code values are repeated 32 times from "00000" to "11111" as shown in B in FIG. 14. In the meantime, the relationship between the ramp voltage and the signal voltage is reversed, and the code values at that moment are saved in the latches. After that, between time T1 and time T2, the lower five bits are read out.

The period from time T1 till time T2 is the period for switching from the first ramp to the second ramp, and, during this period, the values of the lower five bits are read out from the latch circuit 402.

After that, the second ramp appears between time T2 and time T3. In the second ramp, the higher five bits as the code values are incremented from "00000" to "11111" at intervals that are 32 times longer. In the meantime, the relationship between the ramp voltage and the signal voltage is reversed, and the code values at that moment are saved in the latches. After that, the higher five bits are read out.

As described above, two ramps appears, and the 5-bit values obtained from the respective ramps are regarded as the lower five bits and the higher five bits. In this manner, a 10-bit value is obtained. Also, the intervals in the first ramp differ from the intervals in the second ramp, and the intervals in the ramp for obtaining the higher bits are longer than the intervals in the ramp for obtaining the lower bits. In the example case described above, the intervals in the ramp for obtaining the higher bits are 32 times longer.

Figure 15:
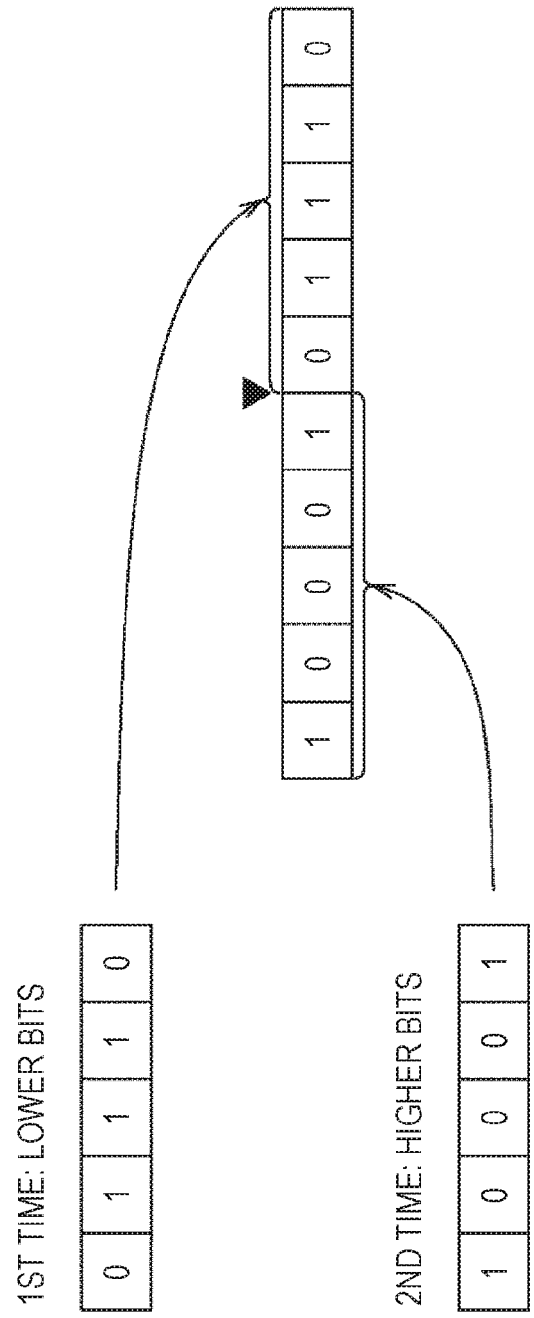
FIG. 15 is a diagram for explaining a combination of higher bits and lower bits.

FIG. 15 shows an example. In the example shown in FIG. 15, a lower 5-bit value "010110" is obtained in the first ramp, and a higher 5-bit value "10001" is obtained in the second ramp. As the lower five bits and the higher five bits are combined, a 10-bit digital value "1000101110" is completed.

As described above, a ramp signal having two ramps is used, and lower five bits and higher five bits are obtained. In this manner, a 10-bit output value can be obtained from the latch circuit 402 having five latch columns 161.

In the above described example, during the second ramp, the code values of the higher five bits are input at 32-times longer intervals. However, the code value intervals may not be varied where the gradient of the ramp signal is made 32 times higher. The former is preferable when priority is put on accuracy, and the latter is preferable when priority is put on speed.

In the above described example, the lower bits are determined in the first ramp, and the higher bits are determined in the second ramp. However, the higher bits may be determined in the first ramp, and the lower bits may be determined in the second ramp.

Still, it is considered preferable to determine the lower bits in the first ramp and determine the higher bits in the second ramp as described above. The reason is that the signal from the pixels 21 might vary slightly due to the influence of dark current or the like, and therefore, the lower bits are preferably determined in an early stage.

Figure 16:
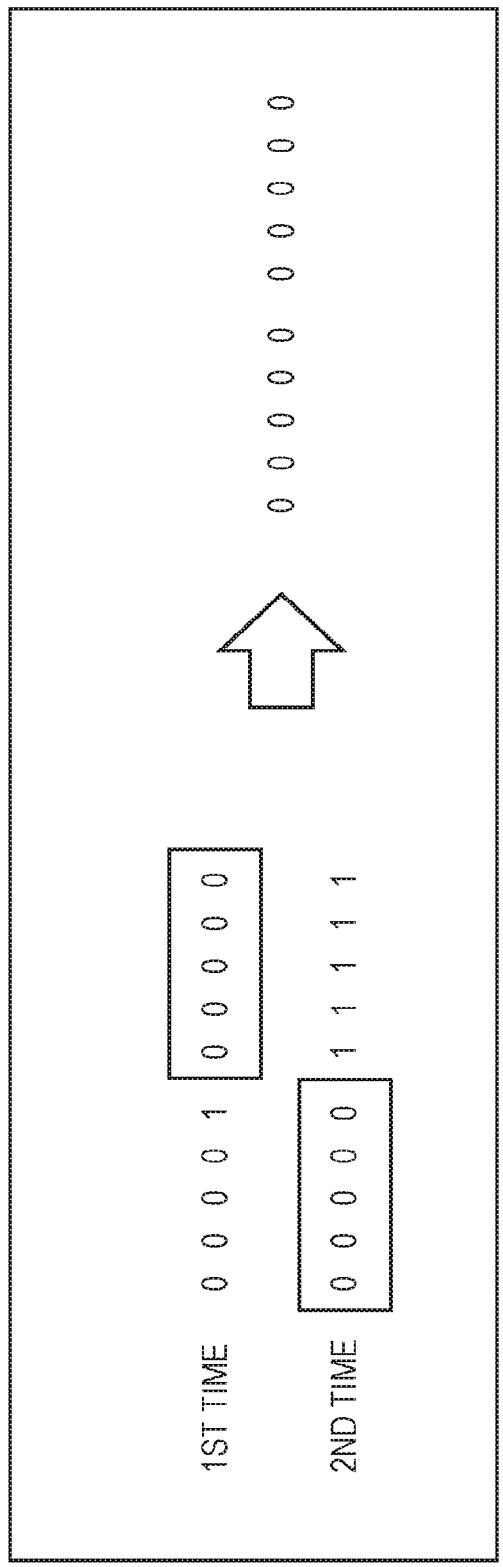
FIG. 16 is a diagram for explaining a combination of higher bits and lower bits.

While two ramps are used to obtain a 10-bit value, there is a time lag between the first ramp and the second ramp. The signal from the pixels 21 might fluctuate during the period between the first ramp and the second ramp. Referring now to FIG. 16, this aspect is described.

During the first ramp, the signal from the pixels 21 is "0000100000", for example. As the lower five bits are obtained from the first ramp, "00000" is obtained in this case. During the second ramp, the signal from the pixels 21 should also be "0000100000", and the higher five bits "00001" are obtained.

However, if the signal from the pixels 21 fluctuates slightly and changes to "0000011111" due to some influence during the second ramp, the higher five bits "00000" are obtained. Therefore, the value eventually obtained in this case is "0000000000" as shown in FIG. 16. Where the value "0000100000" should be obtained, a different value "0000000000" might be obtained.

In this case, during the period between the first ramp and the second ramp, the signal from the pixels 21 changes by 1 from "32" to "31" in decimal notation, and changes only from "0000000000" to "0000011111" in binary. However, in a case where two ramps are used, and five bits are obtained each time, there is a possibility that the value "0000000000", instead of "0000100000", is obtained as described above. In this case, "0" is obtained where the value "32" in decimal notation should be obtained.

In a case where a pixel signal fluctuates to affect the sixth bit as above, a completely different value might be obtained as a result of AD conversion, though the signal has changed only slightly. So as to prevent such a great change, the measures described below may be taken.

As a first measure, a gray code may be used as code values. A gray code is a code that is advantageously used because only one bit changes when a change from a value to an adjacent value occurs.

In a gray code, the digit immediately next to the lower five bits "00000" does not change, and accordingly, there is a lower possibility that a large change as described above occurs. Where a carry is produced at the sixth digit, the value changes as follows: . . . , 10001, 10000, 110000, 110001, . . . . Since the highest or the lowest digit of the lower five digits is subject to a carry, there is no possibility that a completely different value is obtained as in the case with a binary code, even if the sixth digit changes.

For example, in a case where the first ramp shows "0000110000", and "10000" is obtained as the lower five bits, the signal value might decrease by 1 to "0000010000" during the second ramp, and the higher five bits become "00000". In that case, the combined value is "0000010000", and the result of AD conversion is a value that is smaller by 1.

Also, in a case where the first ramp shows "0000110001", and "10001" is obtained as the lower five bits, for example, the signal value might become lower by 2 during the second ramp, and "00000" is obtained as the higher five bits. In that case, the combined value is "0000010001", and the result of AD conversion is a value that is smaller by 3.

The same applies in cases where the pixel values becomes larger and a carry occurs. With a gray code, a result of AD conversion does not become a greatly different value when a change in the pixel signal is small as in the case with a binary code.

A gray code may be applied to all the bits. However, with the variable values and noise and the like in the pixel signal being taken into account, a gray code and a binary code may be used together. For example, a gray code is applied to the lower bits in the variable range, and a binary code is applied to the higher bits.

Even in a gray code, if the pixel signal fluctuates beyond a carry or borrow at the sixth digit, the result of AD conversion does not match the true value. As a second measure, one digit may be shared between the value obtained during the first ramp and the value obtained during the second ramp, by a binary code.

During the first ramp, the lower five digits are converted as in the above described case. During the second ramp, the fifth to ninth digits are input as the code values. As a result, 9-bit AD conversion, instead of 10-bit AD conversion, is performed. If the fifth digit in the second ramp differs from the value in the first ramp, the value in the first ramp is employed and is combined with the sixth digit. In this manner, correction is performed.

Figure 17:
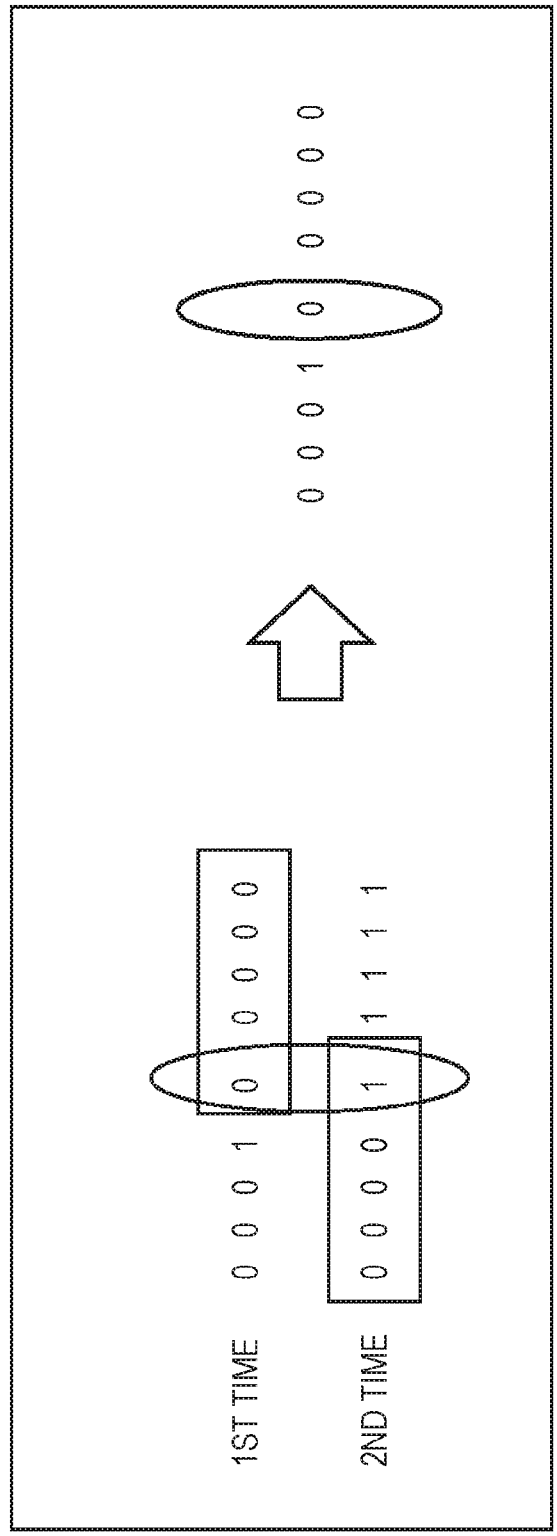
FIG. 17 is a diagram for explaining a combination of higher bits and lower bits.

For example, in a case where the signal is "0000100000" during the first ramp, and the lower five digits are "00000", the signal might change to "0000011111" during the second ramp, and, as a result, "00001" is obtained as the upper digits, as shown in FIG. 17. In this case, as shown in the portion surrounded by an ellipse in the left side in FIG. 17, "0" at the first digit obtained during the first ramp and "1" at the fifth digit obtained during the second ramp should be the same value, but differ from each other.

In this case, it is determined that the difference is caused by a borrow based on the value obtained during the first ramp. The higher five digits are corrected to be "00010", so that "000010000" is obtained as the final result.

In a case where the value obtained during the first ramp is "11111" or the like, and the value obtained during the second ramp is "****0", it can be determined that there has been a carry. That is, there has been a borrow if the fourth digit in the first ramp is "0", and there has been a carry if the fourth digit in the first ramp is "1". As described above, a digital signal can be corrected based on the value of the bit immediately below the shared bit.

As long as a binary code is applied to the shared digit and the digit immediately below the shared digit, a gray code may be applied to the other digits.

As described above, even if the number of bits in the latch circuit 402 is reduced, two ramps are formed so that a 10-bit (or 9-bit) value can be generated. In such a case, the pixels 21 also output a reset level and a signal level. The reset level is the reference voltage of the pixels at that moment. The difference between the signal level and the reset level serves as the true signal value. The corresponding operation is shown in FIG. 13.

Figure 18:
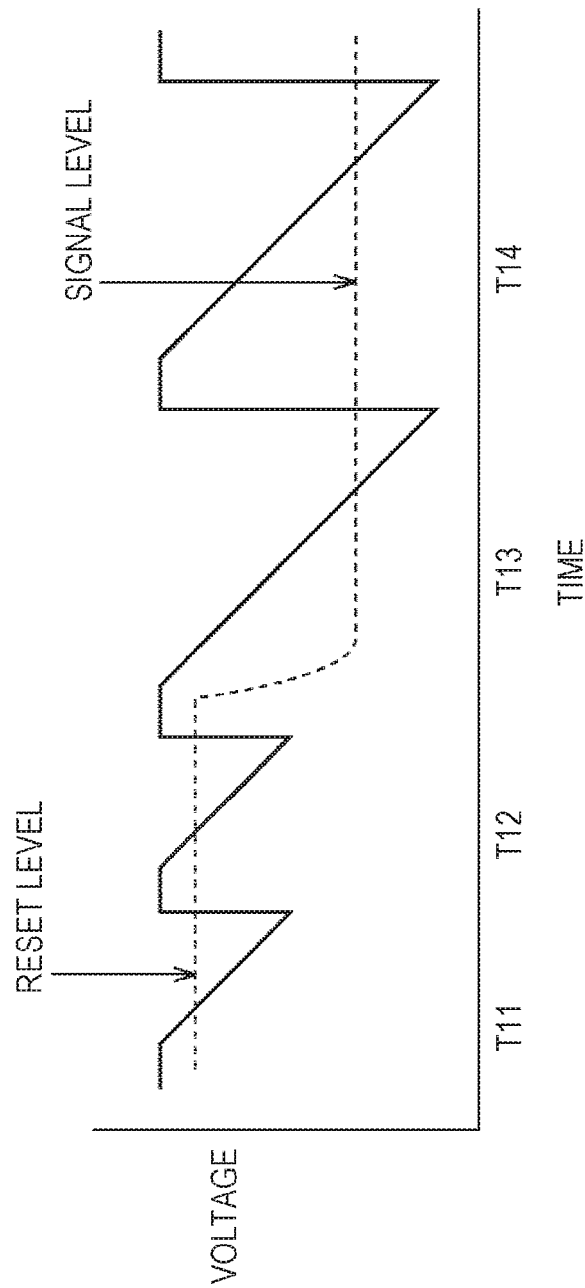
FIG. 18 is a diagram for explaining a read operation.

As described above, the reset level and the signal level each have two ramps and are subjected to AD conversion. As shown in FIG. 18, the first ramp for the reset level starts at time T11, and the second ramp for the reset level starts at time T12.

The first ramp for the signal level starts at time T13, and the second ramp for the signal level starts at time T14. In this manner, digital values are output in the following order: the lower five bits of the reset level, the higher five bits of the reset level, the lower five bits of the signal level, and the higher five bits of the signal level.

These digital signals are stored into the frame memory 301 of the next stage as in the case described above with reference to FIG. 9. At the time when the higher five bits of the signal level are output at last, the reset level is subtracted from the signal level in the subtracter 302. The imaging device, the frame memory 301, and the subtracter 302 may be formed as different semiconductor elements from one another, or may be integrated.

Figure 19:
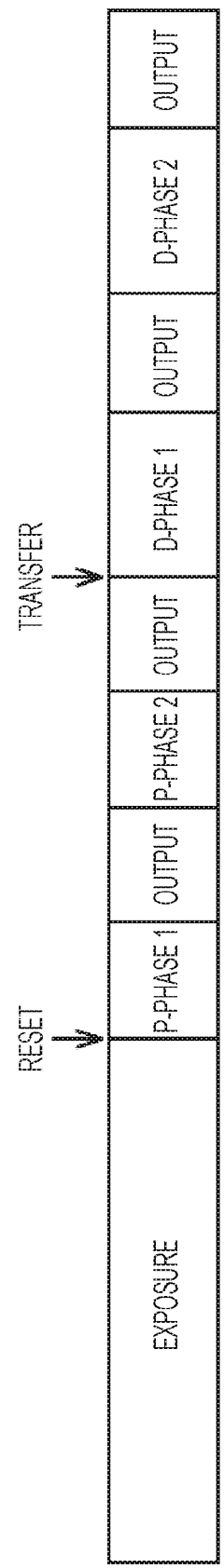
FIG. 19 is a diagram for explaining a read operation.

FIG. 19 is a diagram for explaining the operation of the ADCs 31 when a 10-bit output value is generated from two ramps. After exposure, the floating diffusions 103 of the pixels 21 are reset, and the level thereof is subjected to AD conversion (P-phase period). A P-phase 1 is the period during which lower five bits are converted and are output to the sense amplifier 33. A P-phase 2 is the period during which higher five bits are converted and are output to the sense amplifier 33.

After the output during the P-phase 2 is finished, the photoelectrons of the photodiodes 101 are transferred to the floating diffusions 103. In the same manner as above, conversion and output are repeated twice. The conversion in each of the P-phase 1, the P-phase 2, a D-phase 1, and a D-phase 2 is performed as all the ADCs 31 operate in parallel. The output to the sense amplifier 33 is performed while the ADCs 31 are scanned one by one. In a case where one ADC 31 is assigned to one more than pixel 21, this operation is repeated while the pixels are selected one by one.

As the reset level is distributed in a narrow range, the corresponding ramp signal may be short as shown in FIG. 18. That is, as shown in FIG. 18, the fluctuation range of the voltage of the ramp signal at the time of detection of the reset level may be narrower than the fluctuation range of the voltage of the ramp signal at the time of detection of the signal level. Also, the intervals of the ramp signal at the time of detection of the reset level may be shorter than the intervals of the ramp signal at the time of detection of the signal level.

Among the four ramps including the signal level, the ramps are made straight only in this range. At the portions corresponding to large signal values, the gradients of the ramps are made higher, or the speed of incrementation of the code values is lowered, so that the AD conversion on the high-luminance side can be performed at shorter intervals, and the data amount can be reduced.

That is, the voltage of the ramp signal at the time when a signal of the high-luminance side of the signal level is obtained may vary more rapidly than the voltage of the ramp signal at the time when a signal of the low-luminance side is obtained. Alternatively, the speed of the supply of the code values D to the latch circuit 402 at the time when a signal of the high-luminance side of the signal level is obtained may be lower than the speed of the supply of the code values D to the latch circuit 402 at the time when a signal of the low-luminance side is obtained. With this, the data amount can be reduced.

In such a case, the subtracter 302 calculates a difference from a bent point by referring to the reset level value. The value on the high-luminance side is corrected based on the difference, so that a correct value can be obtained after subtraction. A bent point means a point when the variation of the voltage of the ramp signal becomes larger, or a point when the speed of the code value supply changes. Since the reset level is distributed in a narrow range, the reset level can be expressed by one ramp if the range falls within 1/32 of a D-phase.

In the above described embodiment, one ramp is formed when the latch circuit 52 including the ten latch columns 161-1 through 161-10 is used, and two ramps are formed when the latch circuit 402 including the five latch columns 161-1 through 161-5 is used.

The number of latch columns and the number of ramps to be formed are not limited to the above combinations, which are merely examples. For example, three latch columns may be provided, and three ramps may be formed so that a 9-bit output value can be obtained.

In a case where three ramps are formed, for example, higher bits, lower bits, and intermediate bits between the higher bits and the lower bits are obtained, and a digital value may be generated from a combination of the higher bits, the intermediate bits, and the lower bits.

With this being taken into account, the same number of ramps as the number of bits may be formed, for example. In a case where the same number of ramps as the number of bits are formed according to the present technology, the operation of a sloped ADC is achieved. Even if the number of ramps is increased to the number of bits, each ramp sweeps like a sloped ADC. The ramp waveform may be the same each time, and accordingly, high reproducibility is achieved. Thus, high AD conversion accuracy can be maintained.

In view of this, high-accuracy AD conversion can be performed according to the present technology, even if the same number of ramps as the number of bits are formed.

According to the present technology, the size of a solid-state imaging element can be reduced. Also, one ADC can be shared by a small number of pixels, a higher processing speed can be achieved. Also, even if the object to be imaged is a moving object, an image with little distortion can be obtained.

Also, a structure that consumes less power can be formed. Further, small-sized analog circuits and small-sized digital circuits are prevented from coexisting, and the voltages and the manufacturing processes for the upper substrate and the lower substrate can be optimized.

<Electronic Apparatus>

The present disclosure is not limited to applications to imaging devices, but can be applied to any electronic apparatus using an imaging device at the image capturing unit (photoelectric conversion unit), such as an imaging apparatus such as a digital still camera or a video camera, a portable terminal having an imaging function such as a portable telephone, and a copying machine using an imaging device at the image reading unit. The form of the above described module mounted on an electronic apparatus, or a camera module, is an imaging device in some cases.

Figure 20:
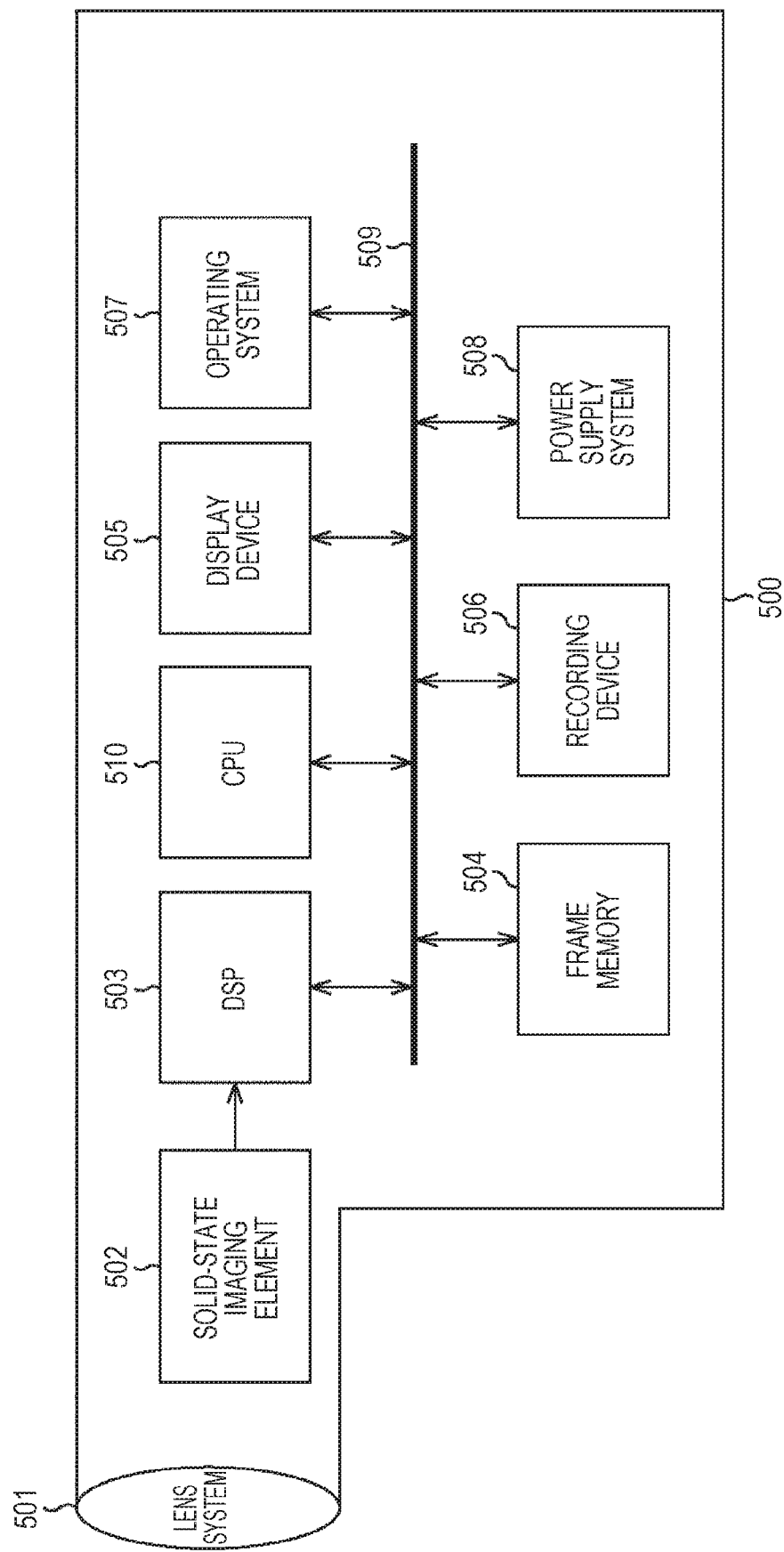
FIG. 20 is a diagram showing the structure of an electronic apparatus.

FIG. 20 is a block diagram showing an example structure of an imaging apparatus as an example of an electronic apparatus of the present disclosure. As shown in FIG. 20, an imaging apparatus 500 of the present disclosure includes an optical system including lenses 501, an imaging element 502, a DSP circuit 503 as a camera signal processing unit, a frame memory 504, a display device 505, a recording device 506, an operating system 507, and a power supply system 508.

The DSP circuit 503, the frame memory 504, the display device 505, the recording device 506, the operating system 507, and the power supply system 508 are connected to one another via a bus line 509. A CPU 510 controls the respective components in the imaging apparatus 500.

The lenses 501 gather incident light (image light) from an object, and form an image on the imaging surface of the imaging element 502. The imaging element 502 converts in pixel unit the light intensity of the incident light gathered onto the imaging surface by the lenses 501 into an electrical signal, and outputs the electrical signal as a pixel signal. A solid-state imaging element according to the above described embodiment can be used as the imaging element 502.

The display device 505 is formed with a panel-type display device such as a liquid crystal display device or an organic Electro Luminescence (EL) display device, and displays a moving image or a still image captured by the imaging element 502. The recording device 506 records the moving image or the still image captured by the imaging element 502 on a recording medium such as a video tape or a Digital Versatile Disk (DVD).

The operating system 507 is operated by a user, and issues operating instructions related to various functions of this imaging apparatus. The power supply system 508 supplies various kinds of power supplies as the operating power supplies for the DSP circuit 503, the frame memory 504, the display device 505, the recording device 506, and the operating system 507, as appropriate.

Such an imaging apparatus 500 is used in a video camera, a digital still camera, or a camera module for mobile devices such as portable telephones. In this imaging apparatus 500, an imaging device according to the above described embodiment can be used as the imaging element 502.

<Recording Medium>

The above described series of processes can be performed by hardware, and can also be performed by software. When the series of processes are to be performed by software, the program that forms the software is installed into a computer. Here, the computer may be a computer incorporated into special-purpose hardware, or may be a general-purpose personal computer that can execute various kinds of functions as various kinds of programs are installed thereinto.

For example, in the imaging apparatus 500 shown in FIG. 20, the CPU 510 loads and executes a program recorded in the recording device 506, to perform the above described series of processes.

The program to be executed by the computer (the CPU 510) may be recorded on a removable medium (not shown) as a packaged medium to be provided, for example. Alternatively, the program can be provided via a wired or wireless transmission medium such as a local area network, the Internet, or digital satellite broadcasting.

In the imaging apparatus 500 (the computer), the program can be installed into the recording device 506 via the bus line 509 when the removable medium is mounted on a drive (not shown). The program can also be received by a communication unit via a wired or wireless transmission medium, and be installed into the recording device 506. Alternatively, the program can be installed beforehand into the recording device 506.

The program to be executed by the computer may be a program for performing processes in chronological order in accordance with the sequence described in this specification, or may be a program for performing processes in parallel or performing a process when necessary, such as when there is a call.

In this specification, a system means an entire apparatus formed with more than one device.

It should be noted that embodiments of the present technology are not limited to the above described embodiments, and various modifications may be made to them without departing from the scope of the present technology.

The advantageous effects described in this specification are merely examples, and the advantageous effects of the present technology are not limited to them and may include other effects.

The present technology can also be in the following forms.

(1) An imaging device including
an upper substrate and a lower substrate that are stacked, wherein
a pixel and a comparing unit that compares the voltage of a signal from the pixel with the ramp voltage of a ramp signal are provided on the upper substrate, the ramp voltage varying with time, and
a storage unit that stores a code value obtained at a time when a comparison result from the comparing unit is inverted is provided on the lower substrate.

(2) The imaging device of (1), wherein the comparing unit is formed with a transistor that receives the voltage of the signal from the pixel at the gate, receives the ramp voltage at the source, and outputs a drain voltage.

(3) The imaging device of (2), wherein a voltage for resetting the transistor is higher than the power-supply voltage of a circuit of a later stage.

(4) The imaging device of (3), wherein the power-supply voltage of the storage unit is lower than the power-supply voltage of the circuit of the later stage.

(5) The imaging device of any of (1) through (4), wherein the power-supply voltage of the upper substrate is higher than the power-supply voltage of the lower substrate.

(6) The imaging device of one of (1) through (5), wherein an analog circuit is provided on the upper substrate, and a digital circuit is provided on the lower substrate.

(7) The imaging device of any of (1) through (6), wherein the comparing unit and the storage unit are formed with Negative channel Metal Oxide Semiconductors (NMOSs), and
the comparing unit and the storage unit have the same high power supply, and have different low power supplies.

(8) The imaging device of any of (1) through (6), wherein the comparing unit and the storage unit are formed with Positive channel Metal Oxide Semiconductors (PMOSs), and
the comparing unit and the storage unit have the same low power supply, and have different high power supplies.

(9) The imaging device of any of (1) through (8), wherein, of the transistors included in the storage unit, a transistor that receives a signal from the comparing unit is made to have a high withstand voltage.

(10) An electronic apparatus including:
an imaging device including
an upper substrate and a lower substrate that are stacked, wherein a pixel and a comparing unit that compares the voltage of a signal from the pixel with the ramp voltage of a ramp signal are provided on the upper substrate, the ramp voltage varying with time, and
a storage unit that stores a code value obtained at a time when a comparison result from the comparing unit is inverted is provided on the lower substrate; and a signal processing unit that performs signal processing on a signal that is output from the imaging device.

REFERENCE SIGNS LIST

10 Upper substrate
11 Lower substrate
21 Pixel
31 ADC
51 Comparator
52 Latch circuit
161 Latch column
221 Comparing transistor
261 Latch circuit
402 Latch circuit

The invention claimed is:

1. An imaging device comprising:
an upper substrate, including:
   a pixel that receives incident light and that generates a signal in response to the received incident light,
   a transfer transistor coupled to the pixel, and
   a comparator configured to compare a voltage of the signal generated by the pixel with a ramp voltage of a ramp signal, and
a lower substrate, including a latch circuit that stores a signal based on an output of the comparator,
wherein a power-supply voltage for the pixel and the comparator is higher than a power-supply voltage of the latch circuit.

2. The imaging device according to claim 1, wherein an analog circuit is provided on the upper substrate and a digital circuit is provided on the lower substrate.

3. An imaging device comprising:
an upper substrate, including:
   a photoelectric conversion element;
   a transfer transistor coupled to the photoelectric conversion element;
   a floating diffusion region coupled to the transfer transistor;
   a reset transistor coupled to the floating diffusion region;
   a comparator configured to compare a voltage of a signal generated by the photoelectric conversion element; and
   a lower substrate, including a including: a latch circuit coupled to the output of the comparator, wherein:
the comparator is coupled to the floating diffusion region and a DAC that supplies a ramp signal,
the latch circuit stores a signal based on an output of the comparator, and
a power supply voltage for the photoelectric conversion element and the comparator is higher than a power supply voltage of the latch circuit.

4. The imaging device according to claim 3, further comprising a plurality of photoelectric conversion elements.

5. The imaging device according to claim 4, further comprising a plurality of transfer transistors, wherein each photoelectric conversion element of the plurality of photoelectric conversion elements is connected to a respective one of the transfer transistors.

6. The imaging device according to claim 5, wherein the floating diffusion is shared by the plurality of photoelectric conversion elements.

7. The imaging device according to claim 6, wherein each of the photoelectric conversion elements in the plurality of photoelectric conversion elements is selectively connected to the floating diffusion by the respective one of the transfer transistors.

8. The imaging device according to claim 6, wherein the plurality of photoelectric conversion elements includes four photoelectric conversion elements.

9. The imaging device according to claim 8, wherein the four photoelectric conversion elements are arranged as a block of 2×2 pixels.

* * * * *